US006640924B2

(12) United States Patent
Messner

(10) Patent No.: US 6,640,924 B2
(45) Date of Patent: Nov. 4, 2003

(54) RIGGING SYSTEM FOR LOUDSPEAKERS

(75) Inventor: Ian Strachan Messner, Turramurra (AU)

(73) Assignee: Meyer Sound Laboratories, Incorporated, Berkeley, CA (US)

( * ) Notice: Subject to any disclaimer, the term of this patent is extended or adjusted under 35 U.S.C. 154(b) by 22 days.

(21) Appl. No.: 10/081,869

(22) Filed: Feb. 20, 2002

(65) Prior Publication Data

US 2002/0153195 A1 Oct. 24, 2002

Related U.S. Application Data

(60) Provisional application No. 60/270,267, filed on Feb. 20, 2001.

(51) Int. Cl.[7] .................................................. H05K 7/18

(52) U.S. Cl. ....................... 181/144; 181/148; 181/199; 403/85; 248/324; 312/111

(58) Field of Search ................................ 312/245, 247, 312/248, 351.1, 107, 108, 111; 403/409.1, 83, 84, 85, 87, 93; 248/284.1, 342, 324, 317, 323, 343, 344; 211/113, 116, 117; 181/199, 148, 187, 145, 30

(56) References Cited

U.S. PATENT DOCUMENTS

| | | | | | |
|---|---|---|---|---|---|
| 4,101,109 | A | | 7/1978 | Edwards | |
| 4,660,728 | A | | 4/1987 | Martin | |
| 5,000,286 | A | * | 3/1991 | Crawford et al. | 181/145 |
| 5,266,751 | A | | 11/1993 | Taguchi | |
| 5,620,272 | A | * | 4/1997 | Sheng | 403/96 |
| 5,758,852 | A | | 6/1998 | Martin | |
| 5,816,545 | A | * | 10/1998 | Malizia | 248/164 |
| 5,819,959 | A | * | 10/1998 | Martin | 211/118 |
| 5,996,728 | A | | 12/1999 | Stark | |
| 6,009,182 | A | | 12/1999 | Gunness | |
| 6,536,554 | B2 | * | 3/2003 | Andrews et al. | 181/199 |
| 2002/0121847 | A1 | * | 9/2002 | Christner | 312/111 |

* cited by examiner

*Primary Examiner*—Robert E. Nappi
*Assistant Examiner*—David Warren
(74) *Attorney, Agent, or Firm*—Donald L. Beeson

(57) ABSTRACT

A rigging system for flying a vertical stack of loudspeakers includes left and right rigging side frames (15, 17). Each rigging side frame includes a frame structure having a top end (43), a bottom end (45), and rear and front corners (51, 53, 55, 57) which is mountable to the side of a correspondingly sized loudspeaker (13). Each rigging side frame further includes a rear link (59) for pivotally linking the rear corner of a rigging frame of one loudspeaker to the rear corner of the same side rigging frame of another loudspeaker placed in stacked relation therewith, and a cam plate link (61) pivotally attached to a cam pivot point (85) at one of the top or bottom ends of the frame structure in displaced relation to the cam link. Two or more link openings (143) are provided in the cam plate link at different angles about the cam plate link pivot point and at different radial distances from the cam plate pivot point. Each rigging side frame further includes a cam plate attachment structure (95, 105) on the top or bottom end of the rigid frame structure opposite the frame's cam plate link. This cam plate attachment structure receives cam plate links of rigging side frames of adjacent loudspeakers (13*a,* 13*b*) in the stack. The cam plate link of one side frame can be deployed about its pivot point to engage in the cam plate attachment structure of an adjacent side frame such that the side frames can be linked together at a desired splay angle by pinning the cam plate link of one frame to the cam plate attachment structure of the adjacent frame using a selected link opening in the cam plate link.

30 Claims, 21 Drawing Sheets

RIGGING SYSTEM FOR LOUDSPEAKERS

REFERENCE TO CROSS-RELATED APPLICATIONS

The application claims the benefit of U.S. Provisional Application No. 60/270,267, filed Feb. 20, 2001.

BACKGROUND OF THE INVENTION

The present invention generally relates to loudspeaker rigging systems and more particularly to rigging hardware for suspending a stacked array of loudspeakers of a sound reinforcement system at a predetermined location relative to an audience. The present invention has particular application in rigging a stacked array of loudspeakers wherein a vertical splay between loudspeakers is desired to achieve a desired coverage and acoustic performance.

Sound systems for large venues typically involve the suspension or "flying" of stacks of loudspeaker in vertical arrays to achieve the necessary acoustic output and coverage for a large audience. Such vertical stacks of loudspeakers are typically suspended and held together by rigging systems which can be attached to rigging hoists which position the stack at a desired elevation and location, typically above or in the vicinity of a performance stage. A flown stack of loudspeakers can include many speaker boxes and the rigging system for flying the stack must be strong enough to support the enormous weight of a large stack. Such rigging systems generally involve the use of metal framing elements secured to the speaker boxes that can be used to link the speakers together in a stacked arrangement and to lift the stack to an overhead flying position.

Often the design requirements of a sound reinforcement system and loudspeaker specifications will require that the individual speaker boxes in a vertical stack of loudspeakers be angled relative to each other so as to create a stack having a vertical splay. Setting the proper splay angle can be critical to achieving desired acoustic performance and minimizing interference between the acoustic output between speakers in the stack. Splay angles, that is the angular separation of the speakers, are provided by adjusting the linkage lengths between rigging the frames of the stacked speakers to create a desired angle. One existing approach for accomplishing this is to provide a relatively long chain linkage at the front corners of the speakers while providing a short link at the back of the speakers. When the speakers are hoisted overhead to their flown position, a pull back is used to pull the front corners of the speakers apart to the extent allowed by the chain linkages. The drawback with pull backs is that they greatly increase the difficulty of the installation, particularly when the speaker stack includes a large number of speakers. With a large stack, separation between the topmost speakers in the stack can only be accomplished by pulling back on the speakers beneath which often can only be accomplished with great difficulty.

Another known approach to creating a desired splay angle is to use straight, rigid and relatively long extension bars to link the front or rear corners of the speaker's rigging frames. Such extension bars have locator holes distributed along their length for achieving different separations between the speaker corners, and can be exchanged with other extension bars with shifted locator holes such that one bar can be used to achieve intermediate splay angles provided by another bar. One problem with such extension bars is that they are often misplaced or lost, and are cumbersome to install. Another difficulty is that the degree of adjustment of the splay angle for any given bar is inherently limited by the size and separation of their locator holes necessary to maintain component strength.

The present invention provides a rigging system for loudspeakers which overcomes the disadvantages of prior art rigging systems. The rigging system of the present invention not only provides for relative ease in the assembly and flying of a vertical stack of loudspeakers, it also permits fine adjustments of the splay angles of the loudspeakers without the need to exchange parts. The present invention also provides a rigging system which holds the separation between speaker boxes in both tension and compression and thereby eliminates the need for pulling back of a flown vertical stack of loudspeakers.

SUMMARY OF THE INVENTION

Briefly, the invention involves a rigging system and hardware for flying a vertical stack of speakers which includes a rigging side frame which is interconnectable with the rigging side frames of other speakers in the stack. A rigging system in accordance with the invention will provide for a left and right rigging side frame for the left and right sides of a speaker cabinet. By fixing the rigging side frames of the invention to the sides of the loudspeaker cabinets, the loudspeakers can be interconnected and splayed at precise splay angles required by the acoustic output characteristics of the loudspeakers without exchanging parts. In accordance with one aspect of the invention, all the elements that link the rigging side frames together are held captive in the rigging side frames such that installers do not have to handle separate linkage elements that can become temporarily misplaced or lost resulting in increased set-up time.

The rigging side frame of the invention includes a rigid frame structure, suitably manufactured of steel tubing, which has a top end, bottom end, and front and rear corners, and which is mountable to the side of a correspondingly sized loudspeaker. The side frame further includes a rear link for pivotally linking the a rear corner of a rigging frame of one loudspeaker to a rear corner of a same side rigging frame of another loudspeaker placed in stacked relation therewith such that the corners of the stacked loudspeakers are joined in a manner that permits the loudspeakers to be pivotally splayed about their rear corners. A cam plate link is pivotally attached to a cam pivot at one of the top and bottom ends of the frame structure in displaced relation to the rear link. Preferably, it is located at or near a front corner of the framed structure to achieve maximum horizontal displacement between the rear link and cam plate. However, it is contemplated that the cam plate can be located inboard the front of the frame structure and still be within the scope of the invention. Also, in the preferred embodiment the rear link and cam plate are located at opposite corners of the frame structure with the preferred location of the rear link being the top rear corner of the frame and the preferred location of the cam plate being the bottom front corner of the frame to permit the cam plate to drop down from the frame by gravity. However, other locations of the rear link and cam plate are possible within the scope of the invention, such as locating both the rear link and cam plate link on either the top or bottom corners of the frame, or placing the rear link on the bottom and the cam plate link on the top.

The cam plate link has at least two, and preferably multiple link openings displaced at different angles about the cam pivot point and falling on different radii relative to the cam pivot point. Each rigging side frame has a cam plate attachment structure on the end of the frame structure opposite the cam plate link for receiving cam plate links of the rigging side frames of adjacent loudspeakers in the stack. Thus, where the cam plate link is provided at the bottom front corner of the frame structure, the corresponding cam plate attachment structure is provided at the top front corner of the frame structure for receiving cam plate links which are pivotally dropped down from the bottom corner of the rigging side frame of the loudspeaker above. The cam plate attachment structure provides for attaching to one of the link openings of the cam plate link of an adjacent frame, suitably by a pin which inserts through the cam plate structure and cam plate link to lock the cam plate of one frame to the frame structure of an adjacent frame. The splay of the speakers is set by selecting an link opening on the cam plate link having a suitable radial distance from the cam plate's cam pivot point. The distance between the pivot point and the selected link opening of the cam plate will set the separation of the rigging side frames, and hence the loudspeakers, at the location of the cam plate link. As the loudspeakers are separated, the rear corners of the side frames, and hence the loudspeakers, will be held together by the rear link of the side frames.

In another aspect of the invention, the frame structure of the rigging side frames have stow away cavity areas which permit the rear links and cam plate to be retracted to a stowed position when not in use. Suitable pin openings can be provided in the frame structure for pinning the rear link and cam plate link in their stowed positions.

DETAILED DESCRIPTION OF THE ILLUSTRATED EMBODIMENT

Figure 1:
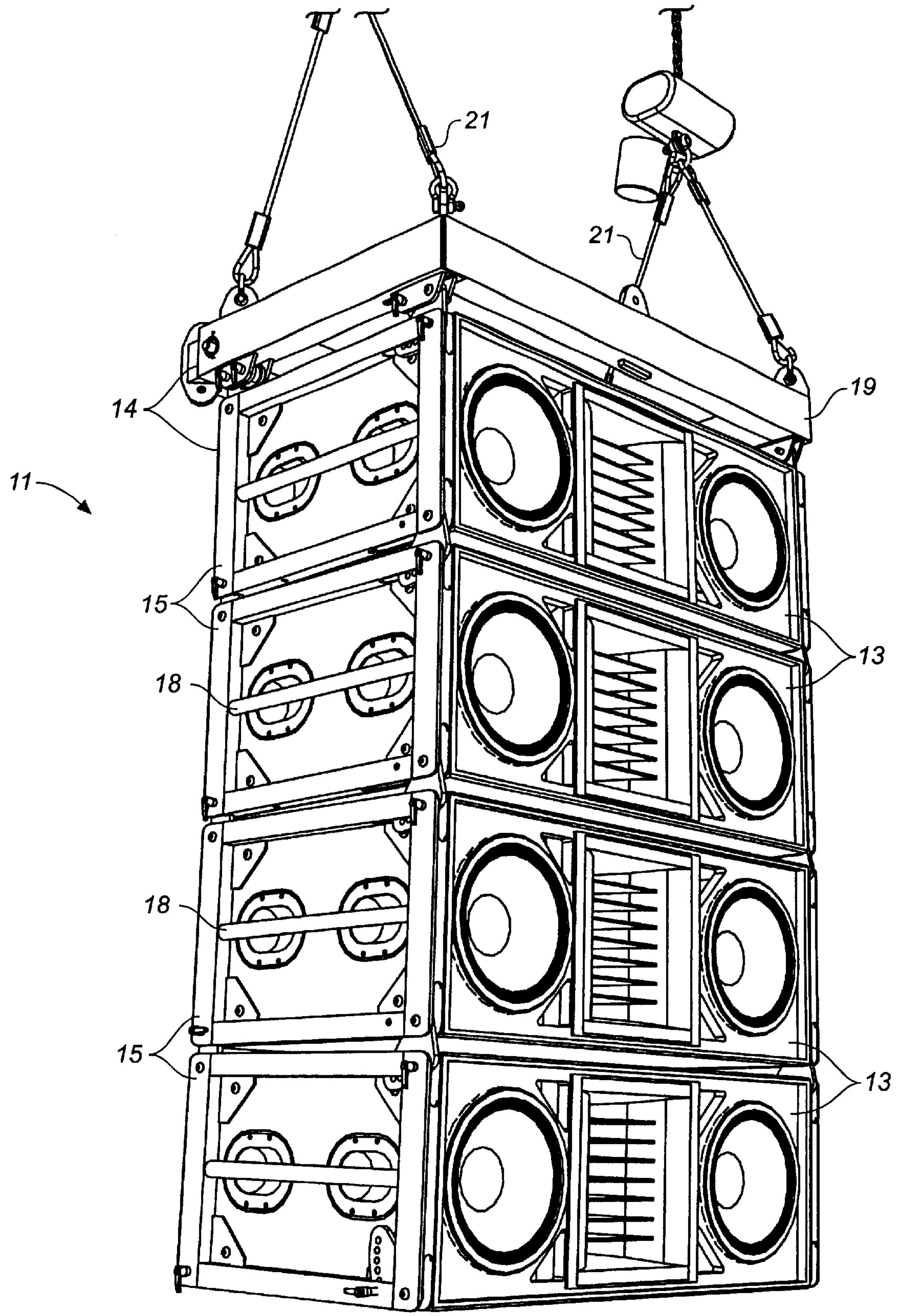
FIG. 1 is a bottom perspective view of a vertical stack of loudspeakers flown by a rigging system in accordance with the invention.
Figure 2:
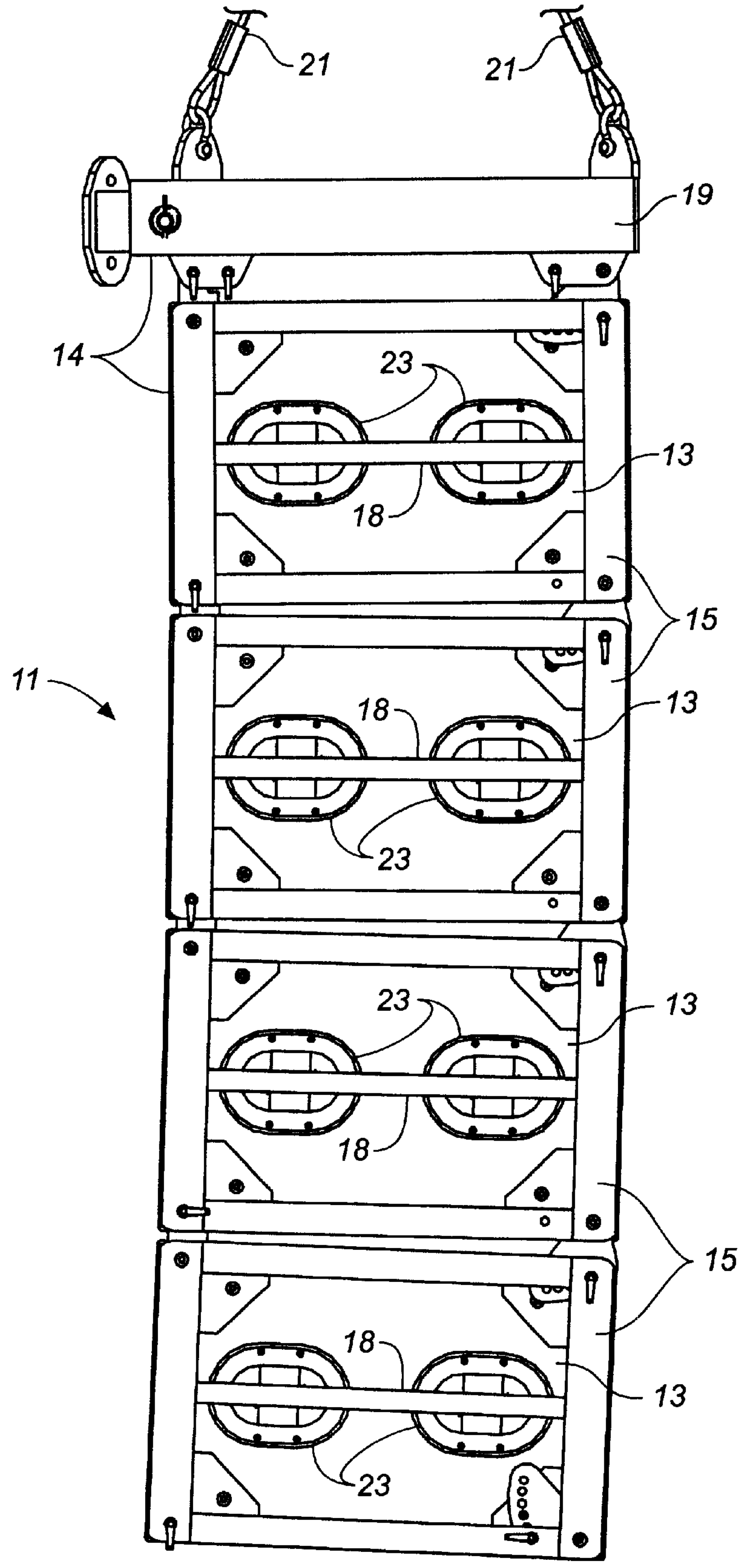
FIG. 2 is a side elevational view thereof.

Referring now to the drawings, FIGS. 1 and 2 generally illustrate the flying of a vertical stack of loudspeakers by a lifting hoist. In FIGS. 1 and 2, the vertical stack 11 consists of four identical loudspeakers 13 suspended and held together by a rigging system 14 comprised of a left and right rigging side frame 15, 17 for each loudspeaker in the stack and a top grid 19 which acts as a load spreader for lifting the stack to which the rigging hoist cables 21 can be attached. Each of the loudspeakers in the stack is shown with conventional recessed lifting handles 23 in the sides of the speaker cabinets. Each of the rigging side frames 15 in turn is shown as having a horizontal center cross bar 18 advantageously positioned over these recessed handles to permit riggers and maintenance personnel to use the rigging frames as a ladder structure to climb to the top of the stack. Due to the placement of the cross bar 18, each of the handle recesses will also provide someone climbing up the sides of the rigging frames with recessed toe holes for the rigger's feet.

It will be understood that, while the vertical stack of loudspeakers illustrated in FIGS. 1 and 2 consist of a total of four loudspeakers, stacks with a greater number of loudspeakers are possible and contemplated. Using the rigging system of the invention, it is contemplated that up to eighteen vertically arrayed loudspeakers weighing approximately 400 pounds each can be flown in a single stack. The limitations on the number of loudspeakers that can be flown in a single stack will depend on the load capacity ratings for the rigging system.

Figure 3:
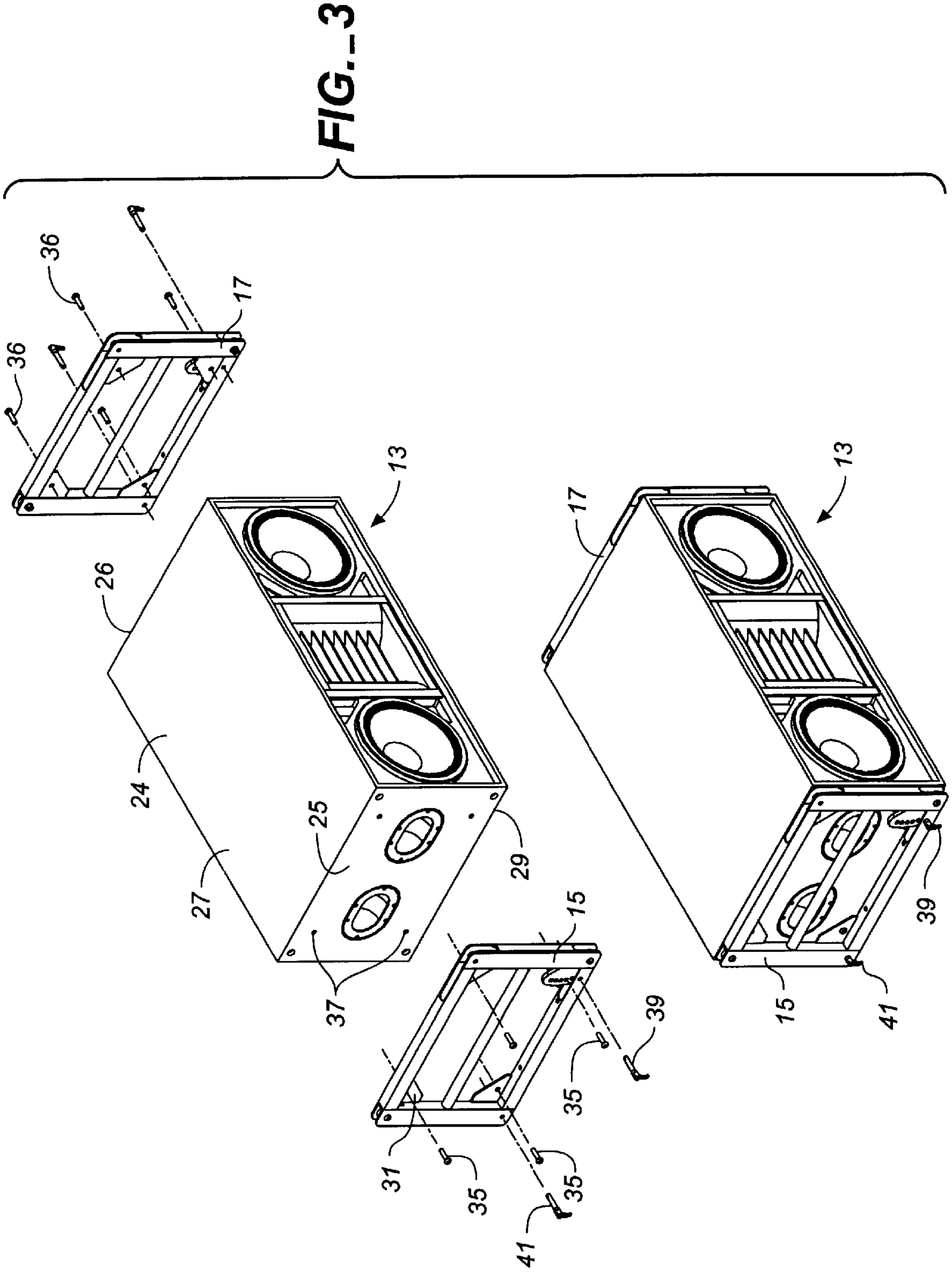
FIG. 3 is an exploded view of the rigging side frames for a single loudspeaker in the stack of loudspeakers shown in FIGS. 1 and 2.

FIG. 3 illustrates in greater detail how the left and right rigging side frames 15, 17 are mounted to the individual loudspeakers in the stack shown in FIGS. 1 and 2. Each of the loudspeakers 13 has a cabinet 24 with a top and bottom 27, 29 defining the top and bottom of the loudspeaker, and having left and right sides 25, 26 to which the left and right rigging side frames 15, 17 are mounted. Each of the rigging side frames includes interior corner mounting plates 31, each with a pass through hole 33 for receiving mounting screws 35 that screw into screw hole inserts 37 in the sides of the speaker cabinet. With the four mounting screws 35, the left side frame 15 is mounted to the left side 25 of a cabinet, while using the four mounting screws 36, the right side frame 17, which is a mirror image of the left side frame, is mounted to the right side 26 of the speaker cabinet. As will be described in greater detail below, with the left and right side frames 15, 17 in place on the sides of the speaker cabinets, the linkage elements of the side frames will be properly located to interconnect with the side frames of adjacent cabinets of a vertical stack of loudspeakers.

FIG. 3 further shows two quick release pins 39, 41 associated with each of the rigging side frames which are used to pin the linkage elements of the frame in place as also hereinafter described.

Figure 4:
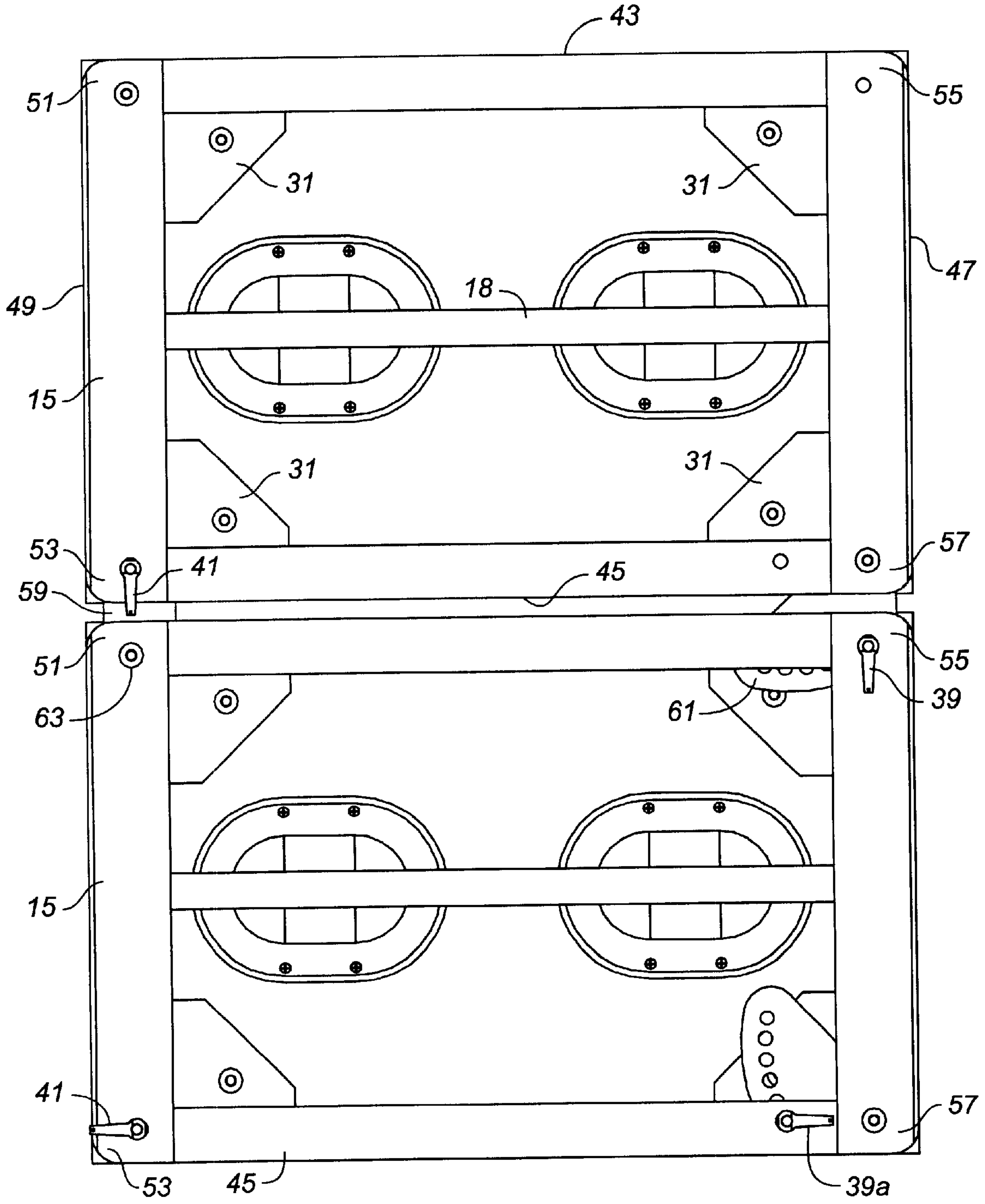
FIG. 4 is a side elevational view of a pair of loudspeakers in stacked arrangement showing the rigging side frames of the rigging system of the invention in greater detail.

FIGS. 4, 5, 5A, and 6 illustrate two adjacent loudspeakers in a loudspeaker stack and how these loudspeakers are interconnected within the stack through the rigging side frames 15, 17 of the rigging system. Referring to FIG. 4, it can be seen that each of the illustrated left side frames 15 has a rigid frame structure that is generally rectangular in shape to correspond to the rectangular profile of the loudspeaker to which it is mounted. Also, each frame structure has a defined top end 43, a bottom end 45, a front 47 and a rear 49. The top and rear of each side frame join to form a top rear corner 51 and the bottom and rear join to form a bottom rear corner 53. Similarly, the top and front of each frame come together at a top front corner 55 while the bottom and front of the frame join at a bottom front corner 57. The two left side frames 15 are interconnected by two linkage elements consisting of a rear link 59 which interconnects the top rear corner 51 of the bottom frame to the bottom rear corner 53 of the top frame, and a cam plate link 61 which connects the top front corner 55 of the bottom frame to the bottom front corner 57 of the top frame.

Figure 5:
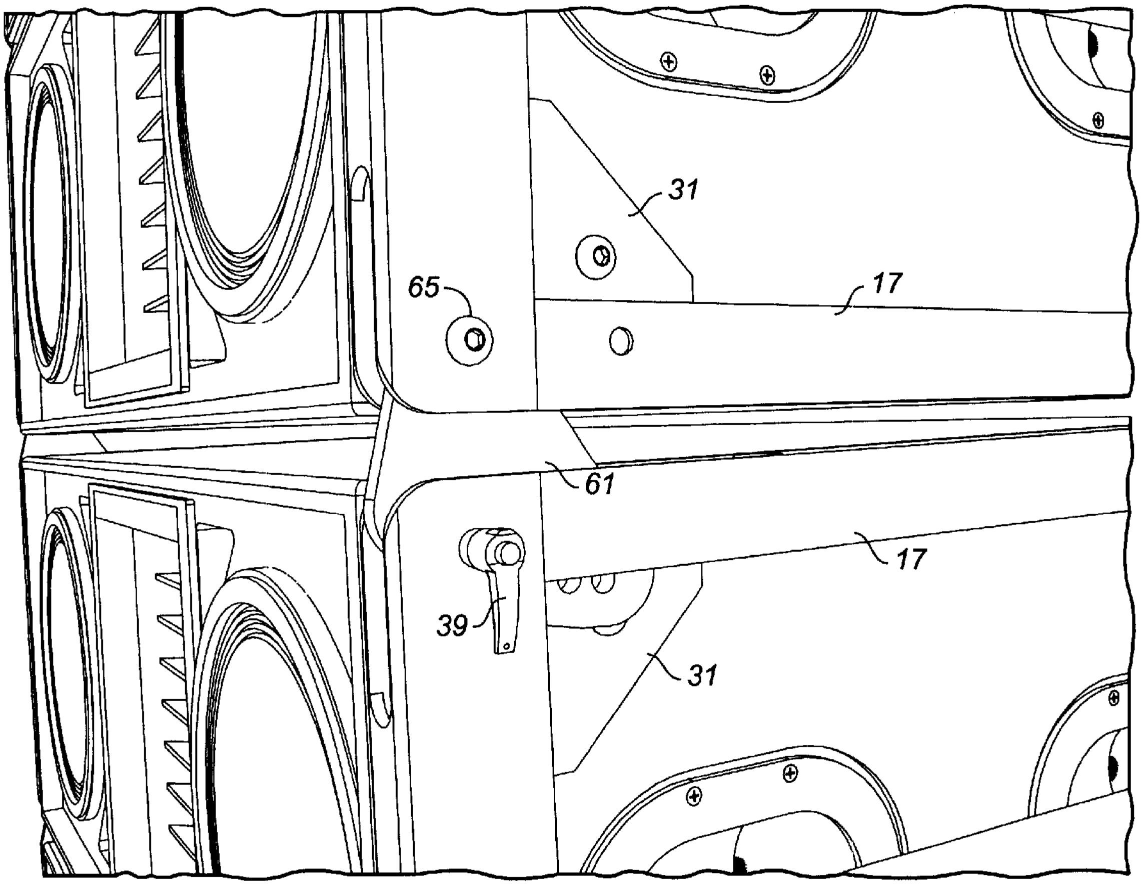
FIG. 5 is an enlarged perspective view of the right front corners of the two stacked loudspeakers shown in FIG. 4, showing the deployment of the cam plate link of the side frames in greater detail.
Figure 5A:
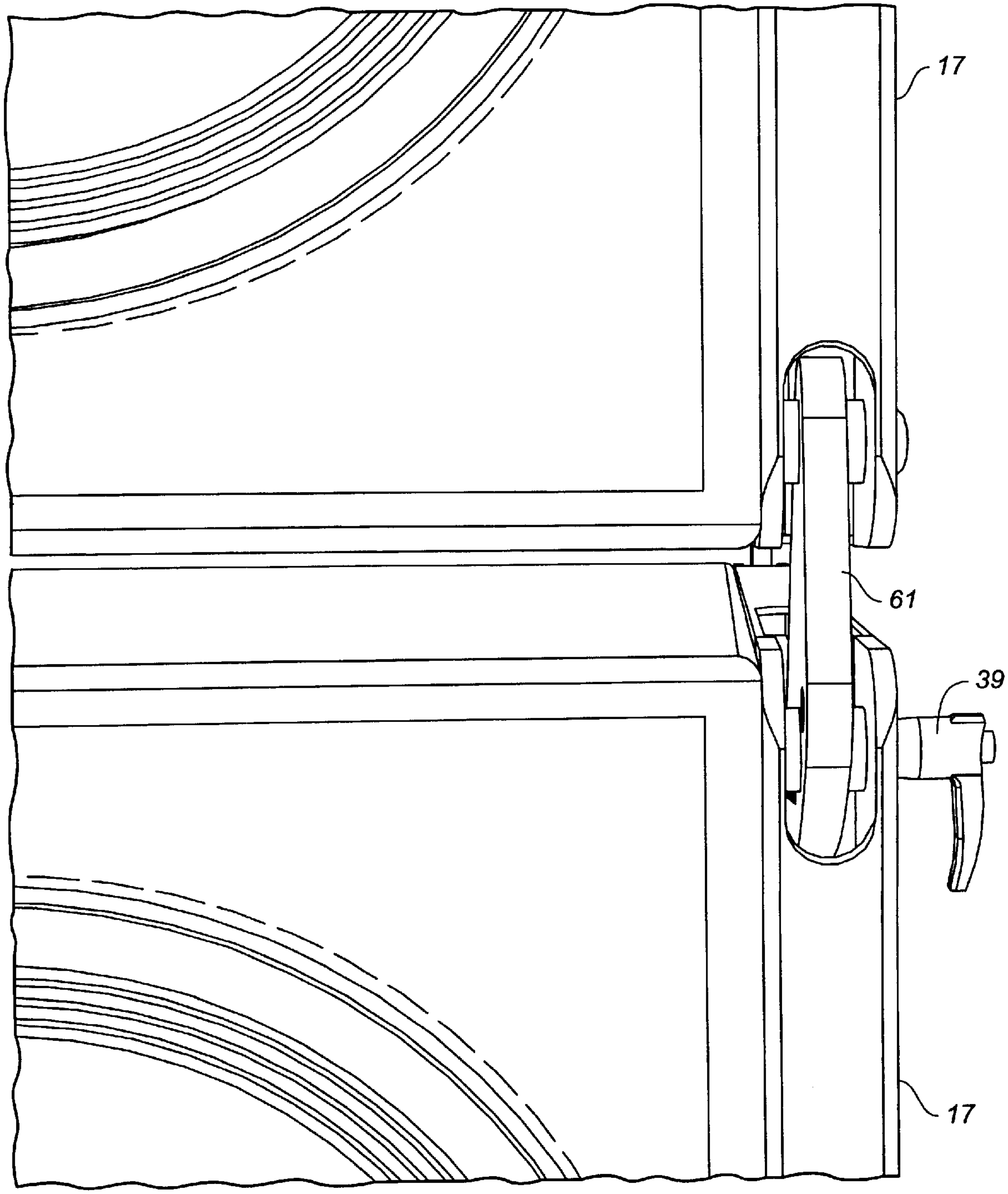
FIG. 5A is another perspective view thereof.
Figure 6:
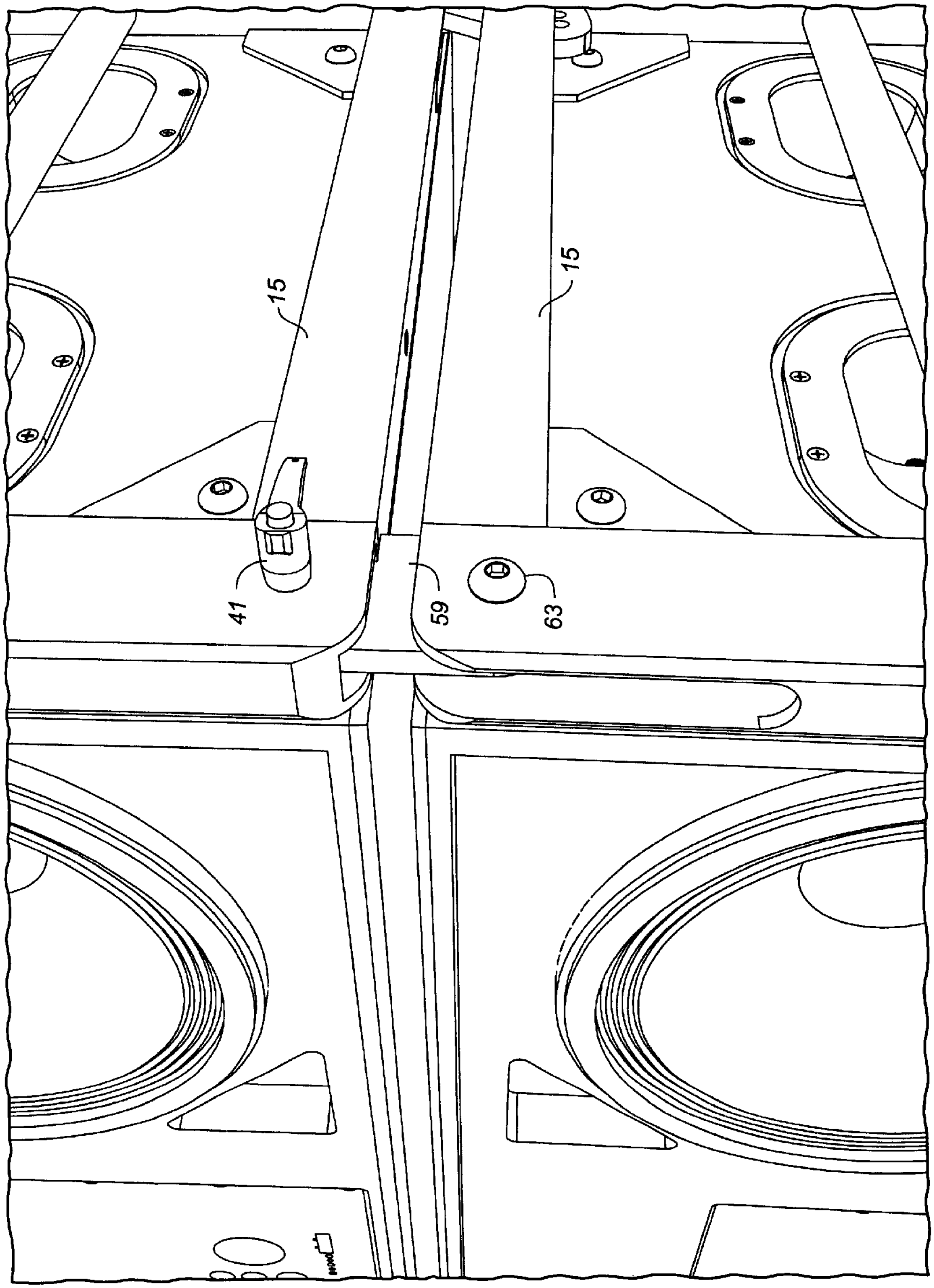
FIG. 6 is an enlarged perspective view of the left rear corners of the two stacked loudspeakers of FIG. 4, showing the deployment of the rear link of the rigging side frames in greater detail.
Figure 13:
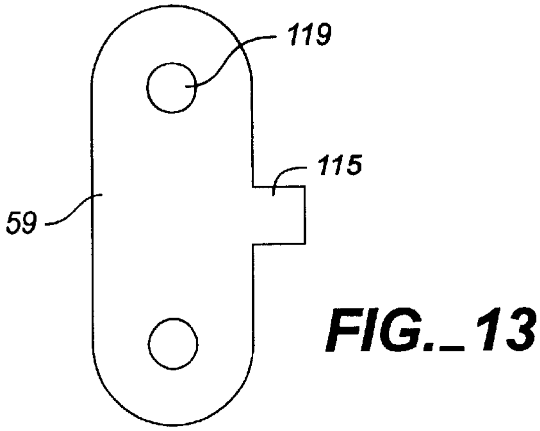
FIG. 13 is a side elevational view of the rear link of the rigging side frame of the invention.

One rear link and one cam plate is associated with each of the frames. Specifically, as shown in FIGS. 4–6, the rear link 59 (shown in greater detail in FIG. 13) is provided at the top rear corner of the side frame where it is attached by a cap head bolt 63. From this position, the rear link extends upward to engage the bottom rear corner 53 of the uppermost frame where it is secured in place by the quick release pin and handle 41. The cam plate link 61, on the other hand, is secured at the bottom front corner of the side frame by means of a cap head bolt 65 which permits the cam plate to swing down by gravity to engage with the top front corner of the bottom most side frame so it can be pinned by quick release pin and handle 39. As shown in FIG. 4, when the cam plate 61 is not in use, it can be held in a stowed position as shown in connection with cam plate 61A associated with the bottom most side frame. It is held in this stowed position by the quick release pin and handle 39*a*, which can be removed to release the cam plate link from its stowed position and used to pin the cam plate to the left side frame of the next speaker added to the bottom of the stack.

Further details of the construction of the rigging side frame of the invention are now described in reference to FIGS. 7–11. While the left side frame is described, it will be understood that the right side frame will be identical to the left side except that the right side frame will be a mirror image of the left side frame such that the linkage elements of the frame have the desired orientation.

Figure 8:
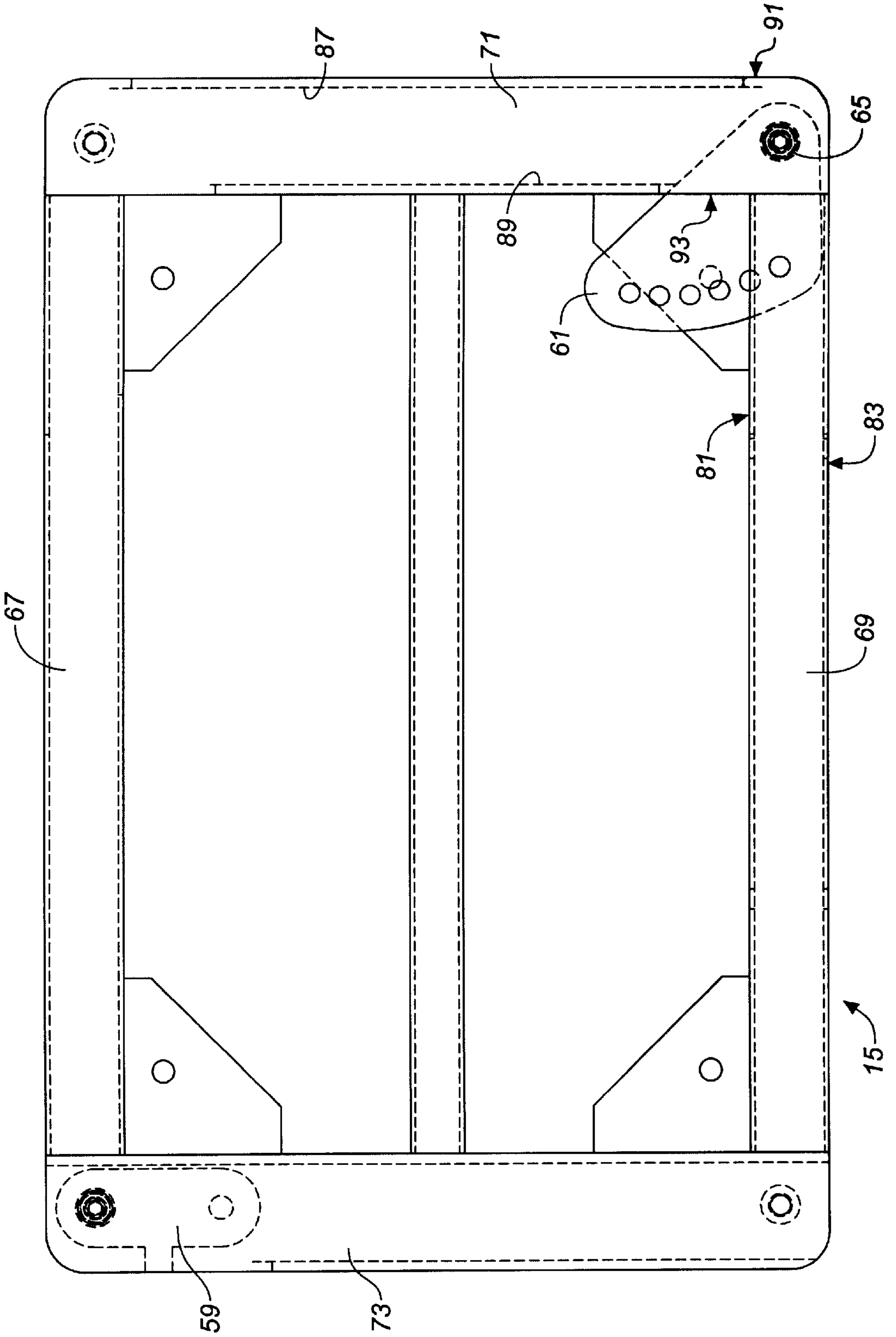
FIG. 8 is a side elevational view of the left rigging side frame showing both the rear link and cam plate link in a stowed position.
Figure 8A:
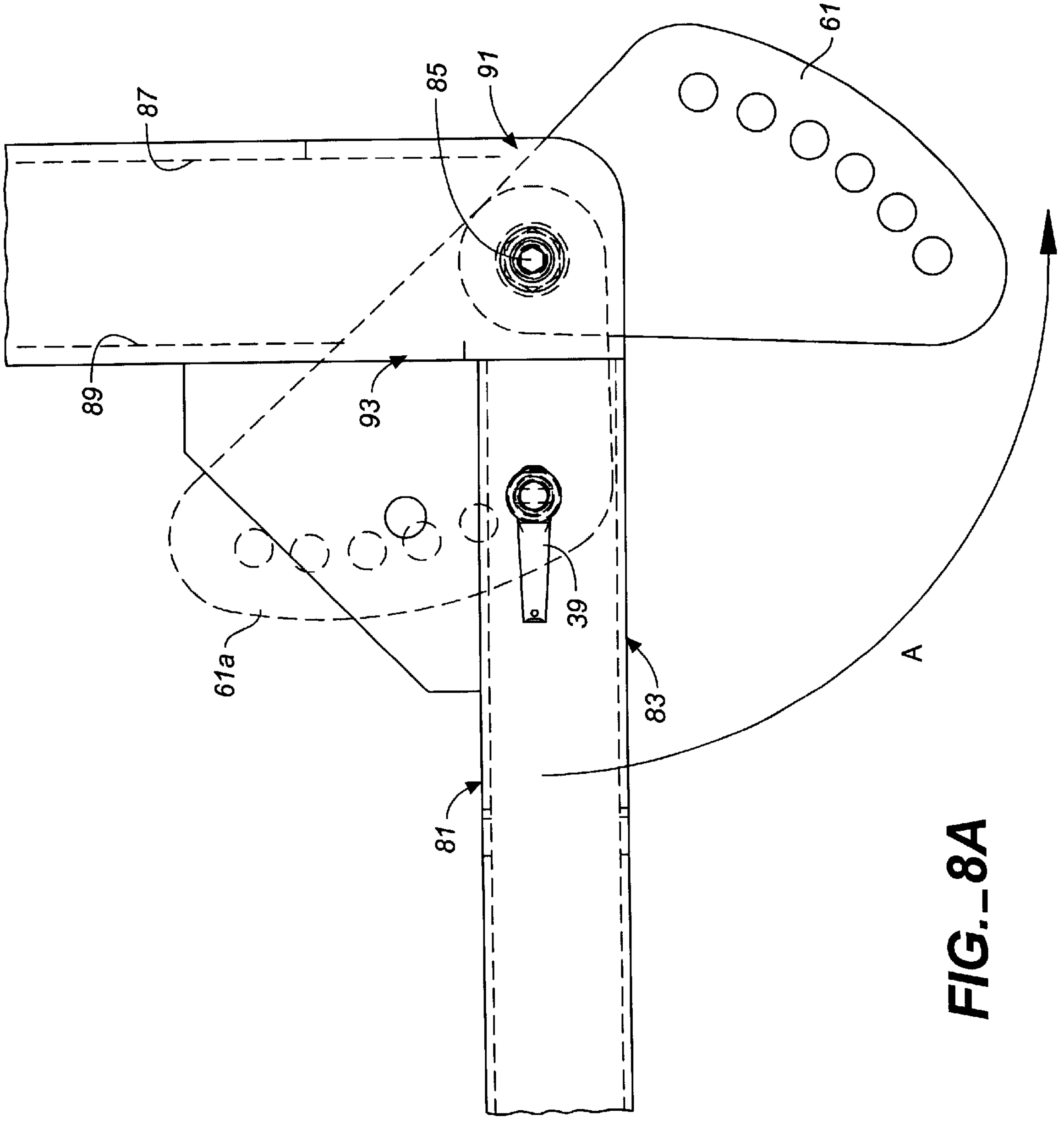
FIG. 8A is an enlarged side elevational view of the bottom corner of the rigging side frame shown in FIG. 8, illustrating the stowed and maximum deployed positions of the cam plate link.

The frame structure of each side frame is formed by top and bottom perimeter rails 67, 69 and front and rear perimeter rails 71, 73, each of which is suitably fabricated of rectangular steel tubing cut to length and welded together to form an integral rectangular perimeter frame 75. This perimeter frame is further strengthened by the cylindrical steel cross-member 18 which, as above described, provides a step ladder feature on the side of the vertical stack of loudspeakers. The bottom front corner of the side frame holding cam plate 61 is formed by the juncture of the bottom and front rail 69, 71. At this corner, both the top and bottom walls 77, 79 of the bottom rail are seen to have cut-out channel openings 81, 83 to allow pivotal motion of the plate about the cam pivot point 85. The extent of rotation of the cam plate is illustrated in FIG. 8A, which shows the cam plate in its completely stowed position denoted by the phantom line representation of the cam plate 61*a* to a fully deployed position through a pivot motion represented by pivot arrow "A." In FIG. 8A it can again be seen that the cam plate is held in its stowed position by one of the quick release handle pins 39 provided with the side frame.

It can further be seen that the front and back walls 87, 89 of the perimeter frame's front rail 71 likewise is provided with channel openings 91, 93 extending up from the bottom front end of the frame in order to accommodate the cam plate in its stowed and fully extended position. Thus, it can be seen that the channel openings 81, 83, 91, 93 in the front and bottom rails generally provide a cam plate stowing structure for capturing the cam plate in the frame. A complimentary cam plate receiving structure is provided at the top front corner 55 of the side frame. There a bottom channel opening 95 extending inwardly from the top front corner of the frame is provided in the bottom wall 97 of top rail 67, along with a similar top channel opening (not shown) in the top wall 99 of the top rail. Channel openings also extend down from the top front corner of the frame in the front and rear walls 87, 89 of the frame's front rail 71 (see channel opening 105 shown in FIG. 7). The cam plate receiving structure formed by these channel openings in the top front corner 55 of the side frame allow a cam plate from a side frame of a loudspeaker immediately above to be pivoted down into the channel openings such that the side plate can be pinned in place, such as by the quick release pin 39 shown in FIG. 4. The quick release pin is inserted through pin holes 107 provided in each of the side walls 109, 111 of front rail 71.

Figure 8B:
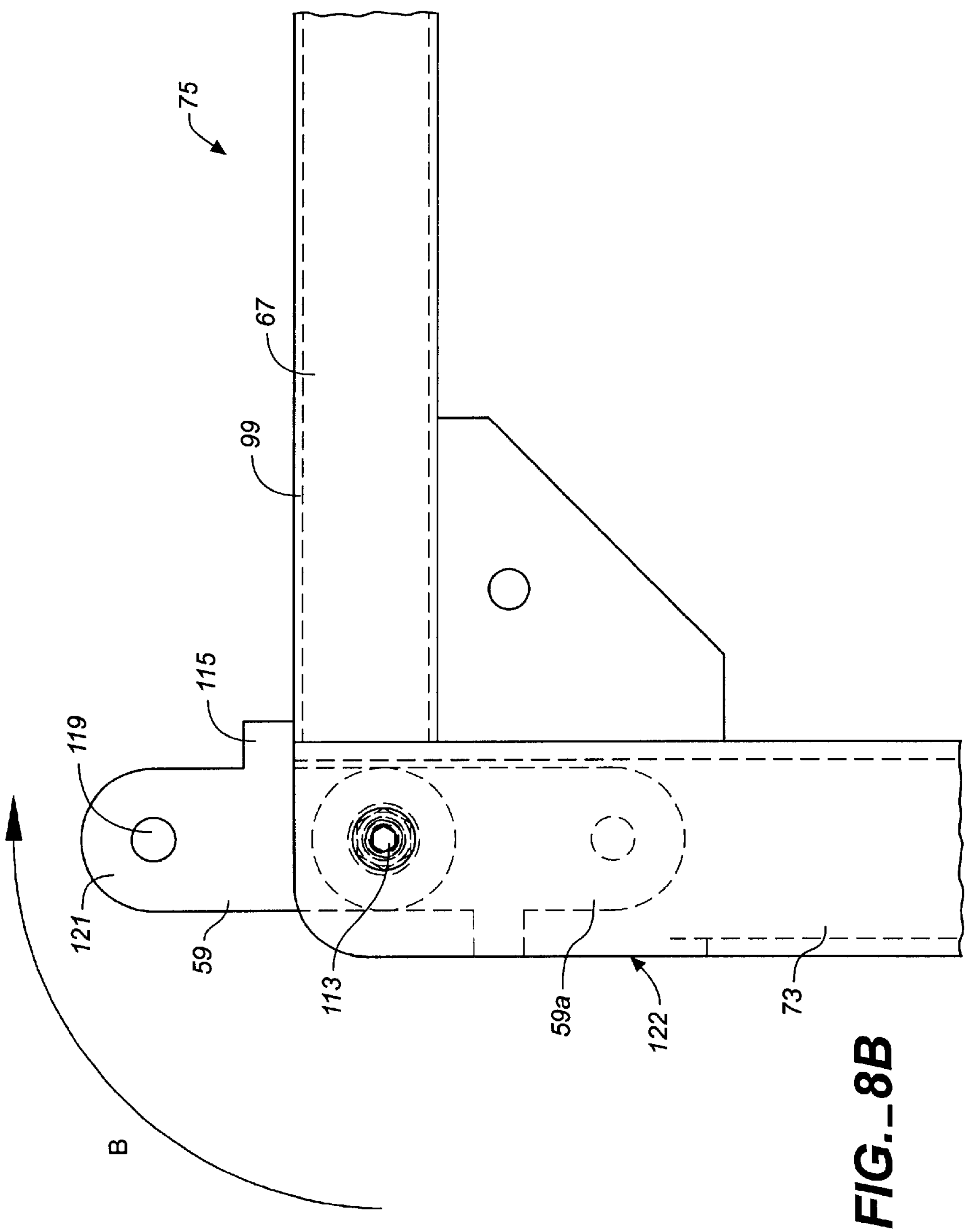
FIG. 8B is an enlarged side elevational view of the top rear corner of the rigging side frame shown in FIG. 8, showing the rear link in its stowed and deployed position.

The deployment of the rear link in the rear top corner of the side frame is illustrated in FIG. 8B. In this figure, it can be seen that the rear link 59 associated with each side frame is pivotally connected at the top rear corner of the frame at pivot point 113. The rear link is held by gravity in its stowed position within the rear rail 73 of the perimeter frame 75 as shown by the phantom line representation of the link 59*a*. To connect the rear link to the bottom rear corner of another side frame, the rear link is pivoted to its fully extended position as represented by pivot arrow "B" in FIG. 8B. The rear link is provided with a stop structure 115 which projects from the link's interior edge 117. As shown in FIG. 8B, when fully extended, the stop structure rests on top of the top wall 99 of the perimeter frame's top rail 67 and will provide an abutment for the bottom rail of the perimeter frame of the other side frame into which the rear link is connected. The stop structure 115 of the rear link will thus permit the pin hole 119 at the extended end 121 of the rear link to be easily aligned with the rear link pin hole structure of the adjacent side frame as described below.

Figure 7:
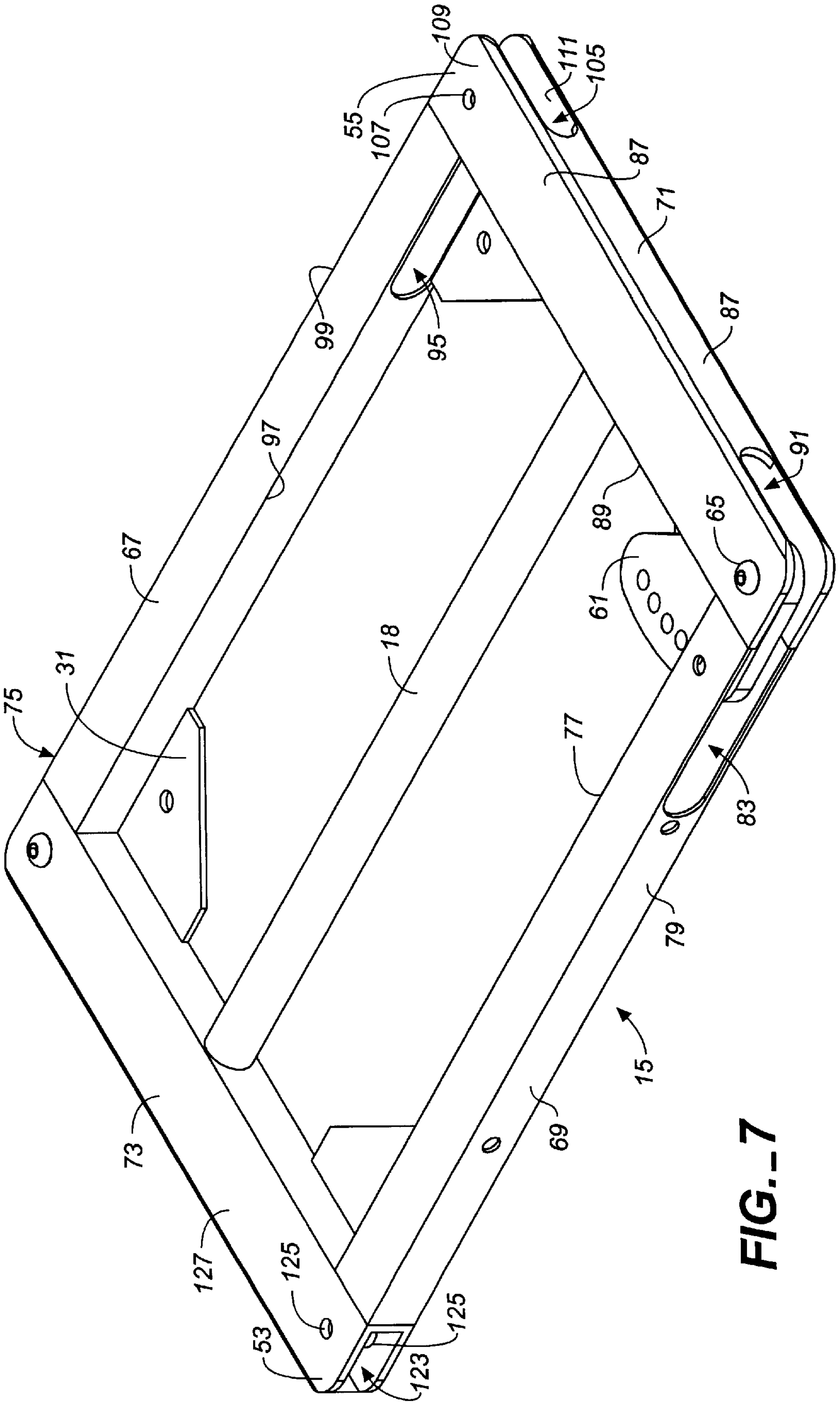
FIG. 7 is a top perspective view of one of the left rigging side frames shown in FIG. 4 showing the cam plate link in a stowed position.
Figure 11:
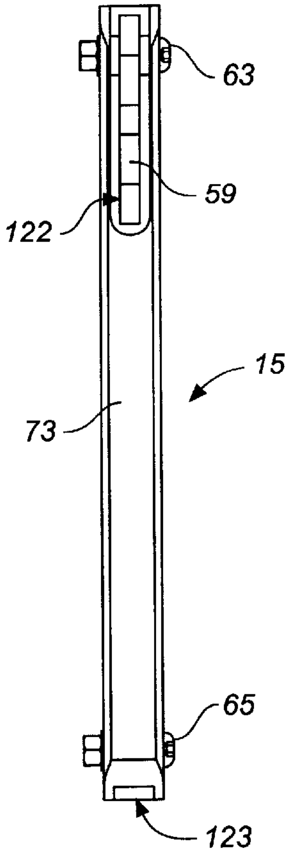
FIG. 11 is a rear elevational view of the rigging side frame of the invention showing the rear link in its stowed position.

As shown in FIG. 11, a channel opening 122 is suitably provided in the rear wall of rear rail 73 to accommodate the rear link as it is rotated between its stowed and extended positions as illustrated in FIG. 8B. Referring to FIGS. 7, 8B and 11, it can further be seen that the extended rear link is used to connect the top and bottom rear corners 51, 53 of adjacent side frames by inserting the extended rear link into the bottom opening 123 of the frame's rear rail 73 such that the pin hole 119 in the extended end of the rear link lines up with the corresponding pin openings 125 in the sidewalls 127 of the rear rail. Once pinhole 119 and pin openings 125 are aligned, the handled quick release pin 41 (see FIG. 4) associated with the upper frame is inserted to lock the rear link in place.

Figure 14:
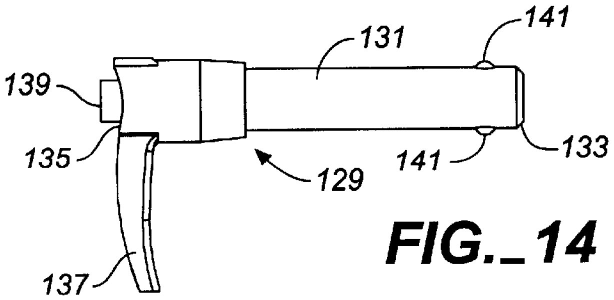
FIG. 14 is a side elevational view of a quick release pin used to secure the rear link and cam plate of the rigging side frame of the invention in their stowed positions as well as to connect the rear link and cam plates to the rigging side frames of adjacent loudspeakers in the stack.

Commercially available quick release pins can be used to pin both the rear links and cam plates at the front and rear corners of the side frames. A suitable quick release pin is a single acting positive locking pin having a corrosion resistant steel spindle manufactured by Avibank Mfg, Inc. of Burbank Calif. Referring to FIG. 14, the quick release pin 129 has an elongated steel spindle 131 with a leading chamfered end 133 and a gripping end 135 having a convenient grip handle 137. A thumb actuated, depressible release bottom 139 activates an internal spring release mechanism (not shown) which permit detente balls 141 to be retracted when the pin is pressed through its associated openings in the side frame, rear link and cam plate. With the pin inserted, release of button 139 will cause the quick release pin to lock into place.

Figure 9:
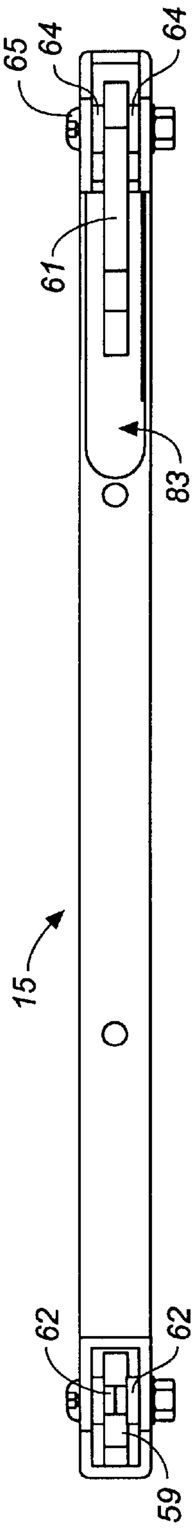
FIG. 9 is a bottom plan view of the rigging side frame shown in FIG. 7.
Figure 9A:
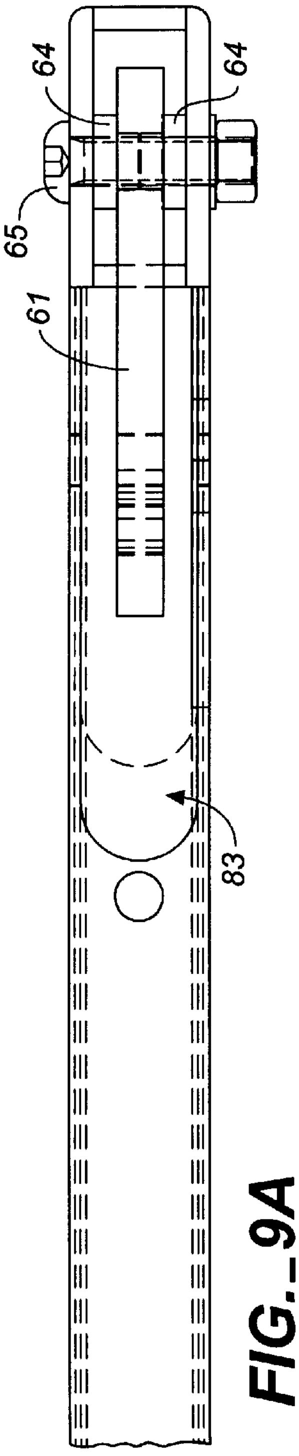
FIG. 9A is an enlarged bottom plan view of the bottom front corner of the rigging side frame shown in FIG. 7 with the cam plate fully deployed.
Figure 10B:
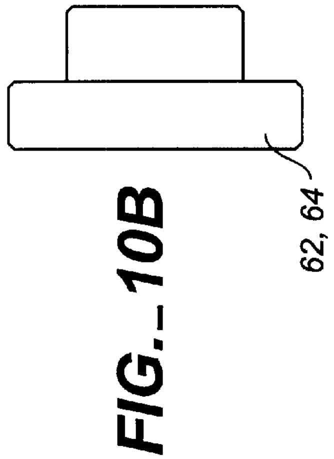
FIG. 10B is an end elevational view thereof.
Figure 10A:
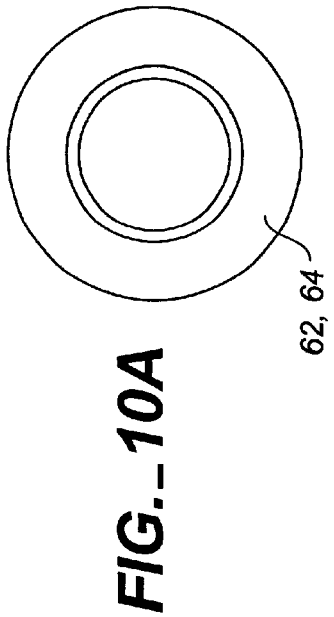
FIG. 10A is a side elevational view of one of the bushings used for holding the rear link and cam plate in the frame structure of the rigging side frame of the invention.

Referring to FIGS. 9, 9A, and 11, it is noted that the rear link 59 and cam plate link 61 are held in their respective corners of the rigging side frames between two bushings 62, 64 which are illustrated in greater detail in FIGS. 10 and 10A. The bushings are suitably metal bushings fabricated of HSLA 70 or HSLA 500 mild steel. The bushings will maintain the links in centered relation within the corners of the frame and provide for an easy pivot motion for the links.

Figure 12A:
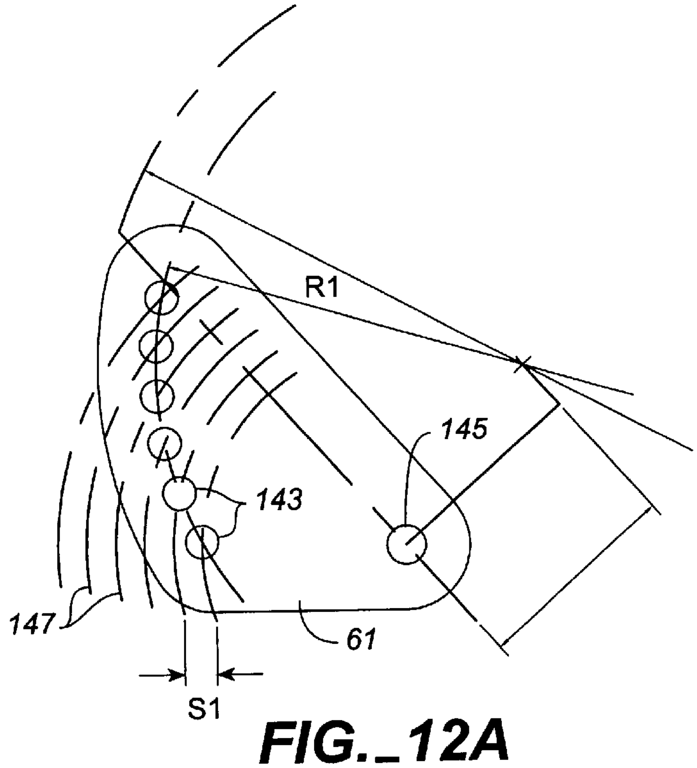
FIG. 12A is a side elevational view of the cam plate of the invention.
Figure 12B:
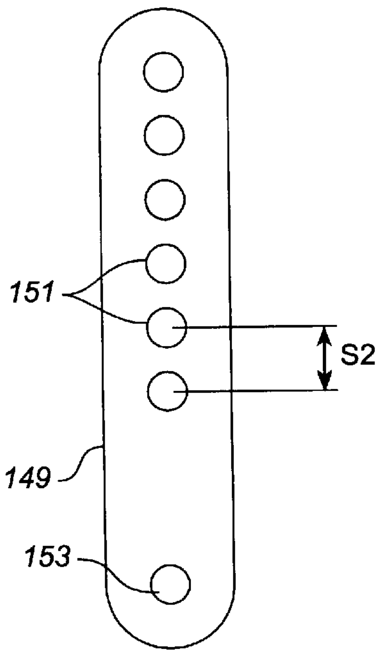
FIG. 12B (PRIOR ART)
FIG. 12B is a side elevational view of a prior art extension linkage bar used in conventional loudspeaker rigging systems for adjusting the vertical splay angle of a loudspeaker stack.

FIGS. 12A and 12B provides a comparison between the cam plate link of the present invention (shown in FIG. 12A) used to achieve different vertical splay angles in a stack of loudspeakers and conventional extension bars (shown in FIG. 12B) used in prior art rigging systems. Referring to FIG. 12A, the cam plate 61 has a series of link openings 143 distributed along a radius R1 at different radial displacements from cam plate pivot hole 145. The different radial displacements of the link openings are represented by curved lines 147, the spacing of which represent the incremental adjustment that can be made in the vertical splay angle of the loudspeakers as the cam plate is pivoted to a new link opening as hereinafter described. Due to the distribution of the link openings across the cam plate, the incremental changes in displacement between link openings ("S1") in the direction of pivot hole 145 can be made relatively small for achieving fine adjustments in the vertical splay angle while at the same time maintaining the strength of the plate.

By contrast, the prior art extension bar 149 shown in FIG. 12B has a series of link openings 151 which are aligned with an attachment hole 153 at the opposite end of the bar. To achieve adjustments in the vertical splay angle the link opening is selected which sets the desired spacing for the chosen splay angle. However, because the link openings are aligned in the direction of the loading force, the openings must be further apart, denoted by the spacing S2, in order to maintain the structural integrity of the bar under load conditions. Thus, only relatively coarse adjustments can be made in the vertical splay angle.

Figure 15A:
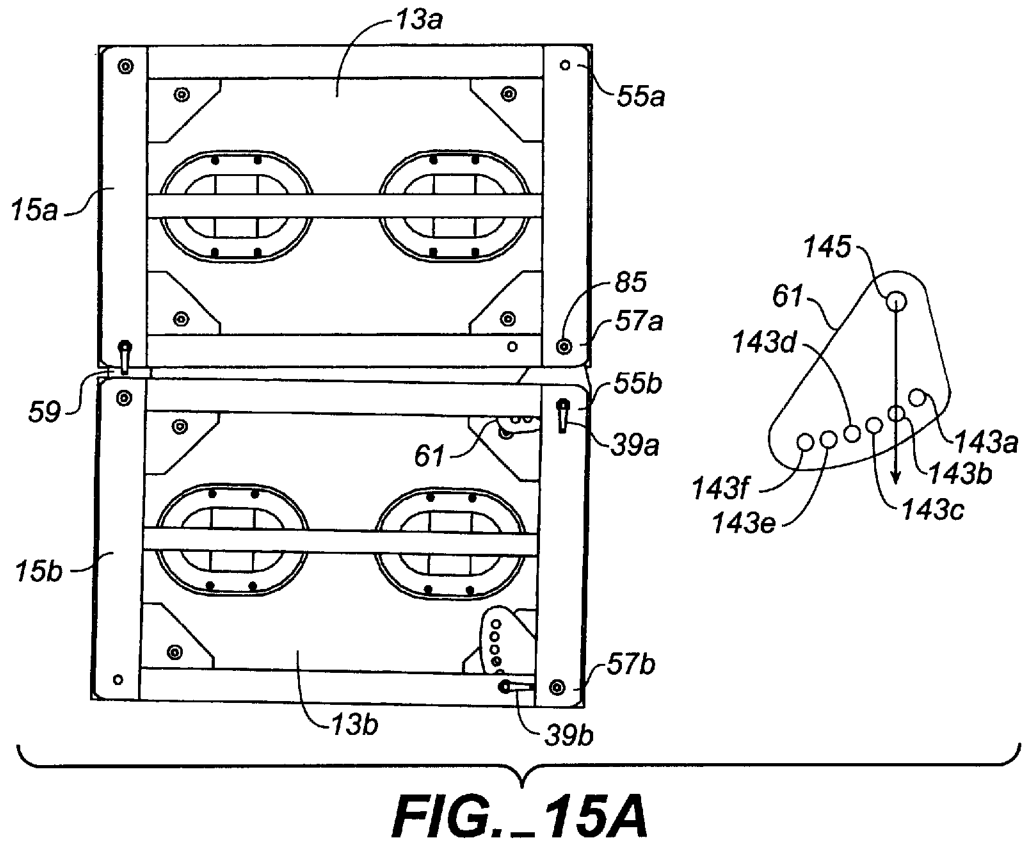
FIG. 15A is a side elevational view of the side frames of two adjacent loudspeakers in a stack with the cam plate of the side frame of the topmost loudspeaker connected to the side frame of the bottommost loudspeaker so as to produce a minimum vertical splay angle.
Figure 15B:
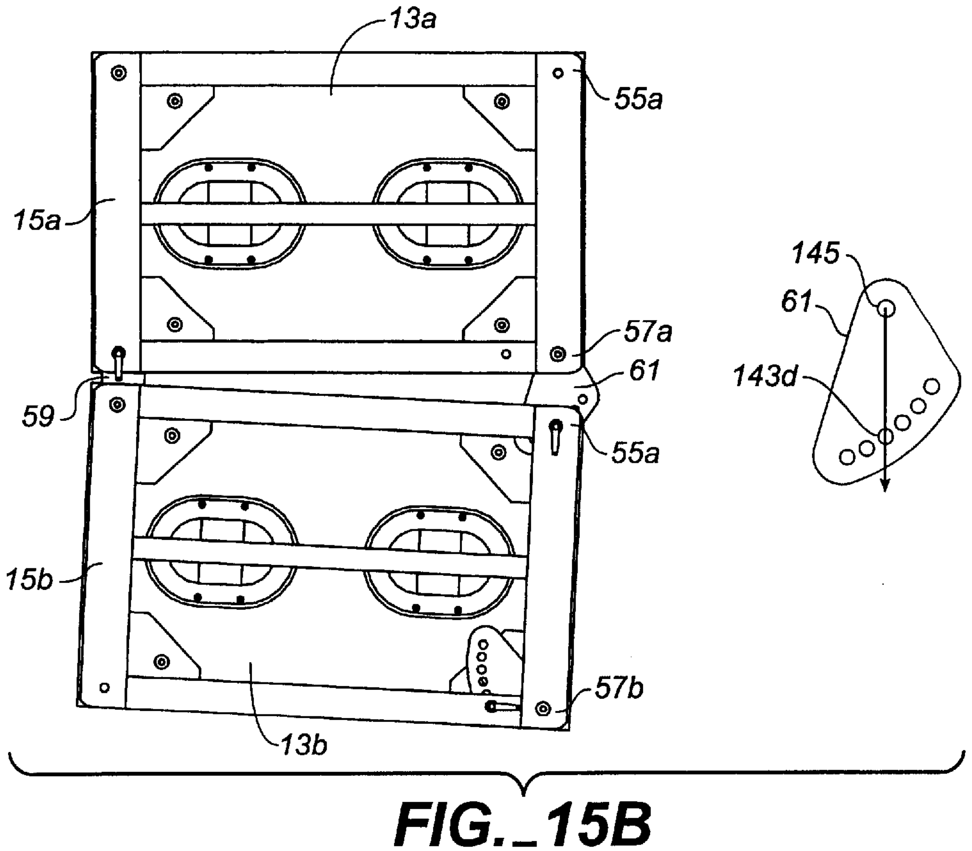
FIG. 15B is a side elevational view of the side frames of two adjacent loudspeakers in a stack with the cam plate of the side frame of the topmost loudspeaker connected to the side frame of the bottommost loudspeaker so as to produce an intermediate vertical splay angle.
Figure 15C:
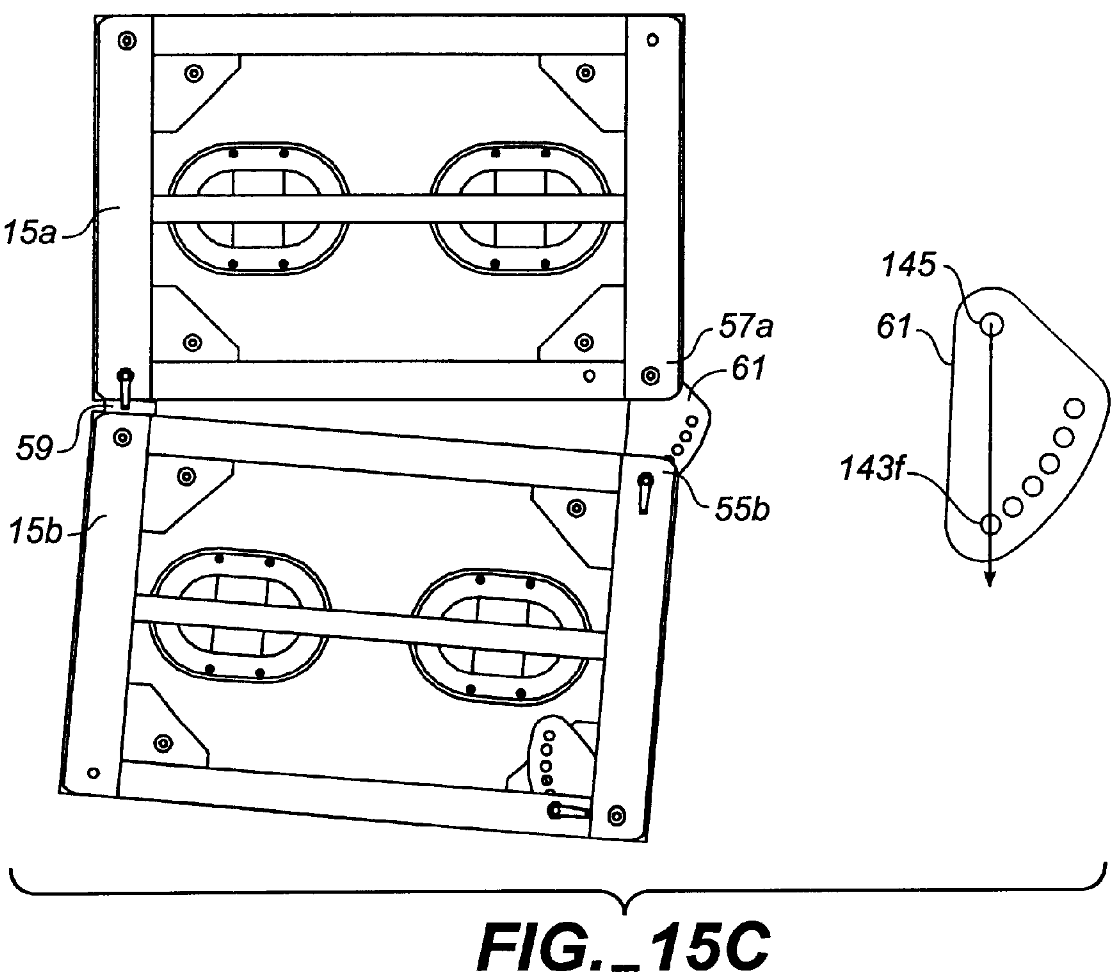
FIG. 15C is a side elevational view of the side frames of two adjacent loudspeakers in a stack with the cam plate of the side frame of the topmost loudspeaker connected to the side frame of the bottommost loudspeaker so as to produce a maximum vertical splay angle.

The use of the cam plate link of the invention to adjust the vertical splay angle is illustrated in FIGS. 15A–15C which show left side frames 15*a*, 15*b* mounted to the cabinets of two adjacent loudspeakers 13*a*, 13*b* interconnected at different vertical splay angles. In FIG. 15A, side frames 15*a*, 15*b* are interconnected by rear link 59 and by a cam plate 61 which has a series of six link openings 143*a*–143*f* for producing different vertical displacements from the cam plate pivot hole 145. In FIG. 15A, the cam plate is rotated around its pivot point 85 on the front bottom corner 57*a* of side frame 15*a* such that the second link opening 143*b* of the cam plate can be pinned by quick release pin 39*a* (associated with the top side frame 15*a*) to the top front corner 55*b* of the lower side frame 15*b*. This rotation of the cam plate link produces a first incremental vertical splay angle from horizontal. In this connection, it is noted that pivoting the cam plate clockwise from this position by one pin setting, that is to link opening 143*a*, produces an interconnection with no splay angle as shown in FIG. 4.

FIG. 15B shows another rotation of the cam plate link for producing an intermediate vertical splay angle. Specifically, in FIG. 15B, cam plate 61 is pivoted in a further counterclockwise direction to permit the plate to be pinned to intermediate link opening 143*d* which produces a larger vertical splay angle than shown in FIG. 15A. In FIG. 15C, the cam plate is shown pivoted still further in a counterclockwise direction to provide for a pin setting at the last link opening 143*f* in the plate. This rotation of the cam plate produces the maximum vertical splay angle provided by the rigging system. Thus, it can be seen that incremental adjustments can be made to the splay angle from zero degrees (horizontal) associated with link opening 143*a* and the maximum angle produced by link opening 143*f*. It is contemplated that a suitably designed cam plate link with six link openings as shown can provide splay angles in one degree increments from zero degrees to 5 degrees.

It will be appreciated that a solid cam plate will provide greater structural integrity to the structural interconnection between the front corners of the side frames and thus the maximum load-bearing capacity. However, it is not intended that the invention be limited to a cam plate link of the illustrated solid construction. For example, the interior of the cam plate may be cut out to reduce the amount of material in the plate. Shapes other than the shape of the cam plate shown are also possible.

The top lifting grid used to pick up a stack of loudspeakers interconnected by the side frames of the invention is illustrated in greater detail in FIGS. 16, 17, 17A and 17B. The lifting grid 19 is comprised of a front frame 155 formed by front rail 157, rear rail 159, and side rails 161, 163. The front, rear, and side rails of the front frame are suitably fabricated of rectangular steel tubing welded into a frame as shown. An extension frame 165 having extension side legs 167, 169 can be adjustably engaged in the front frame 155 by sliding the side legs 167, 169 into the rear ends 171, 173 of the hollow side rails 161, 163 of the front frame. Using hitch pins 177, the rear frame can be locked into two separate positions, a stowed position and an extended position, in the front frame. In its extended position, the rear frame will provide additional load-spreading capability for the top grid for particular applications.

It is further seen that the front frame 155 has top lugs 179, 180 distributed around its perimeter for providing attachment points for the rigging cables 21. The rear extension frame is also provided with corner lugs 182 which permit attachment from the bottom. In the case of large stacks of speakers which have a substantially shifted center of gravity, the rear frame can be extended and tie cables (not shown) connected between the bottom of the speaker stack and the rear frame corners in order to balance the load.

The lifting grid 19 is provided with two cam plate links 181, 183 at its front corners 185, 187. Each of these cam plates is attached to the underside of the lifting grid by parallel attachment plates (parallel attachment plates 189 on the left front side of the grid and parallel attachment plates 191 on the right front side of the grid) to permit the cam plates to swing down and engage the front top corners of the rigging side frames 15, 17 of the topmost speaker in a stack in the same manner as the cam plates 61 associated with the side frames are used to interconnect the rigging side frames of adjacent loudspeakers. Similarly, the rear corners 193, 195 of the lifting grid, and specifically the rear underside of the grid's side rails 161, 163, each have rear attachment plate pair 197, 199 for receiving the rear links 59, 60 of the side frames 15,17 of the topmost loudspeaker in the stack to be lifted. Rear links 59, 60 are pinned to the rear attachment plates 197, 199 by quick release pins 175, 177. An added extension link 201 is provided with the top grid to permit adjustment in the spacing of the rear attachment as hereinafter described.

Figure 16:
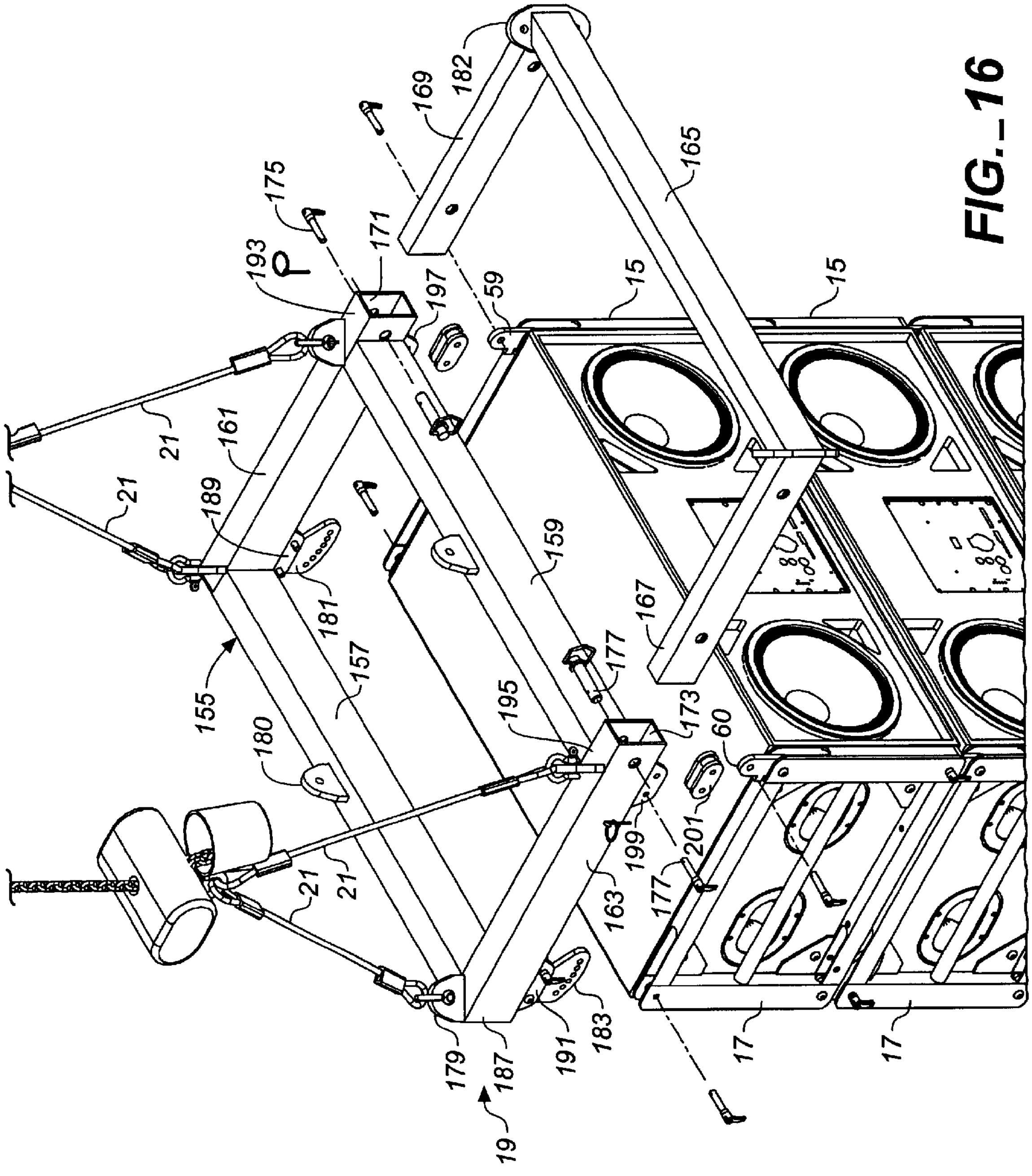
FIG. 16 is an exploded top perspective view of a top lifting grid of the rigging system of the invention shown connected to rigging hoist cables and disposed to pick up a stack of loudspeakers having rigging side frames in accordance with the invention.
Figure 17:
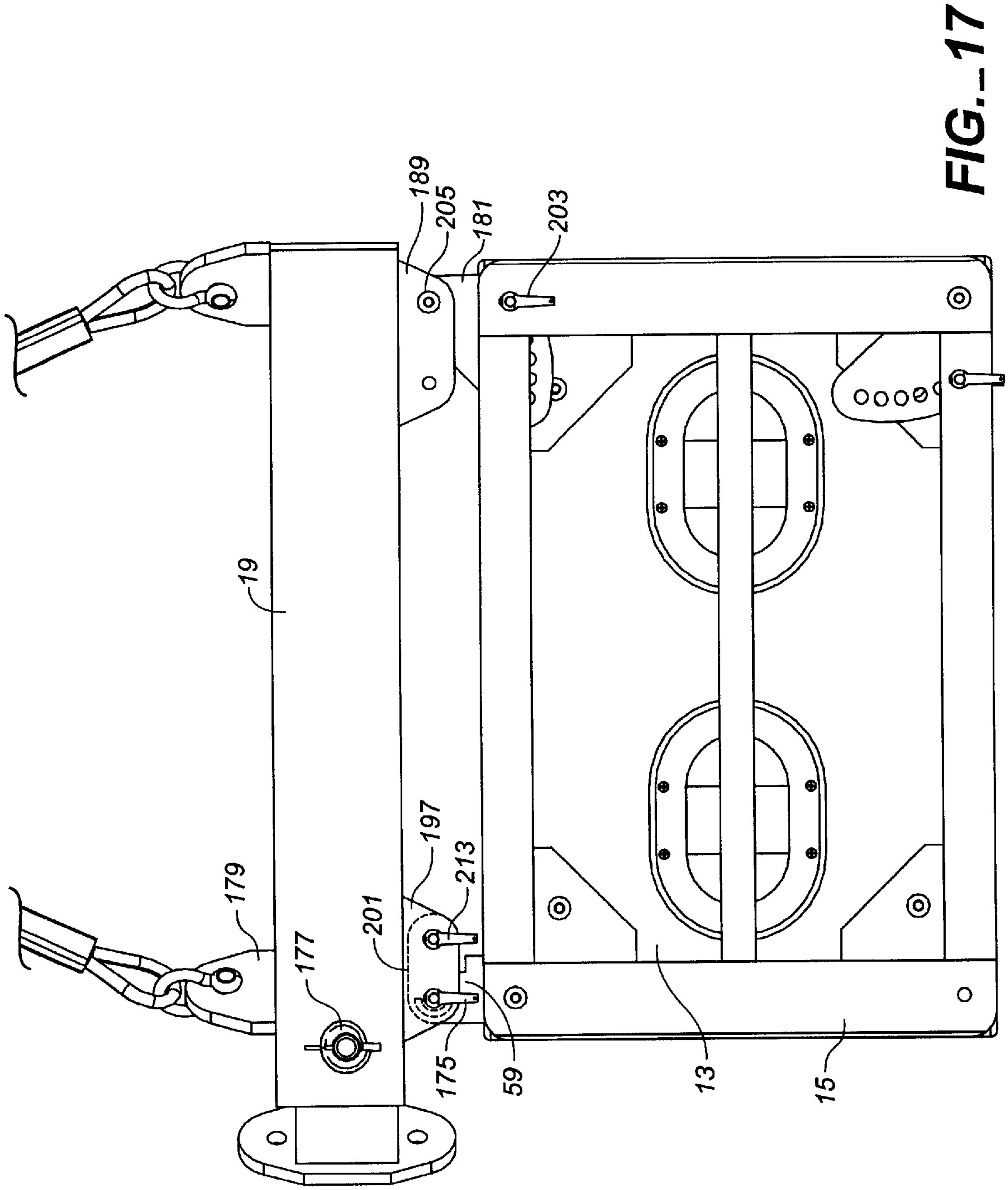
FIG. 17 is a side elevational view of the top lifting grid of the invention shown holding a single loudspeaker having rigging side frames in accordance with the invention in a horizontal plane.
Figure 17A:
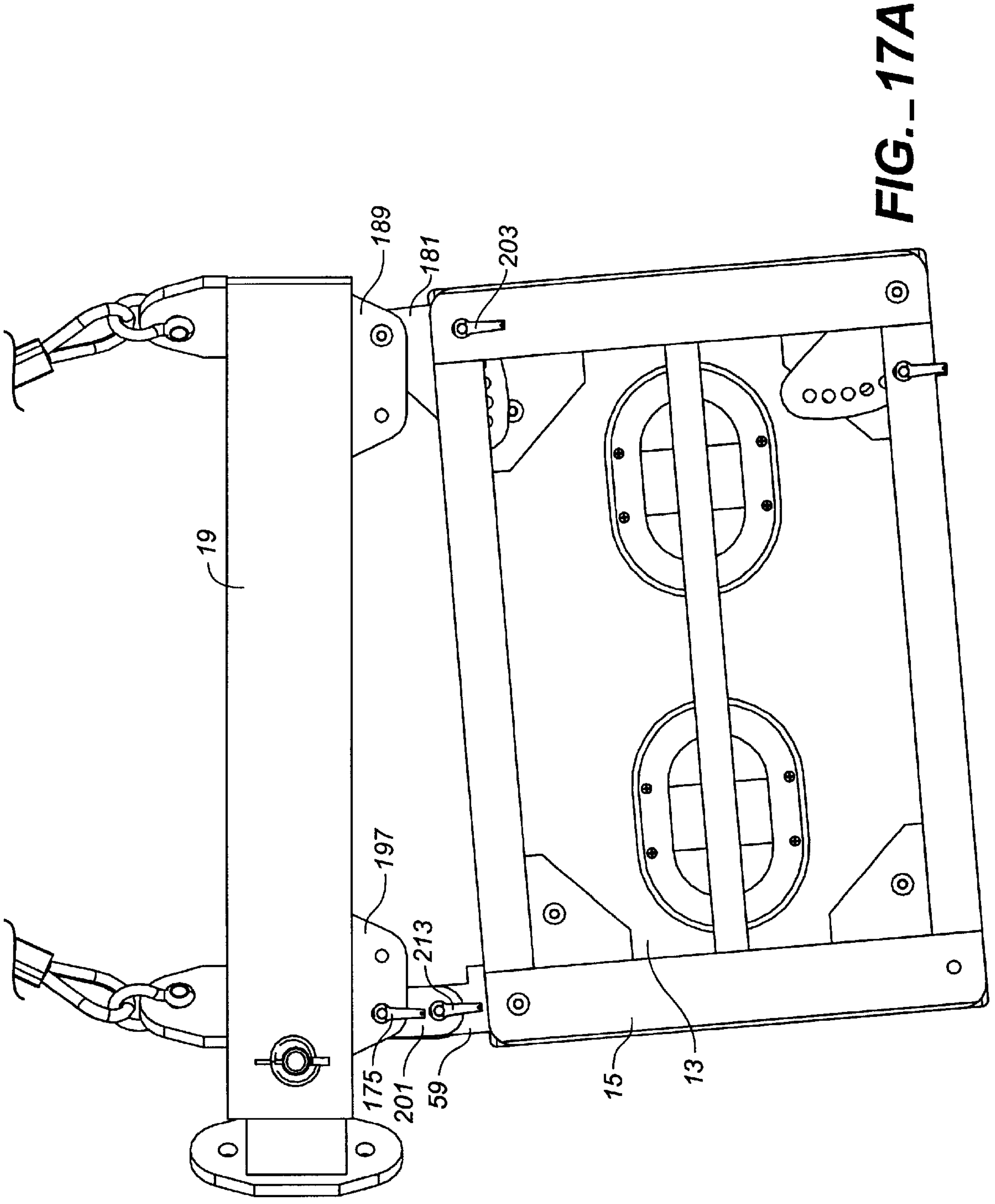
FIG. 17A is another side elevational view thereof, showing the loudspeaker flown at a maximum positive angle relative to horizontal.
Figure 17B:
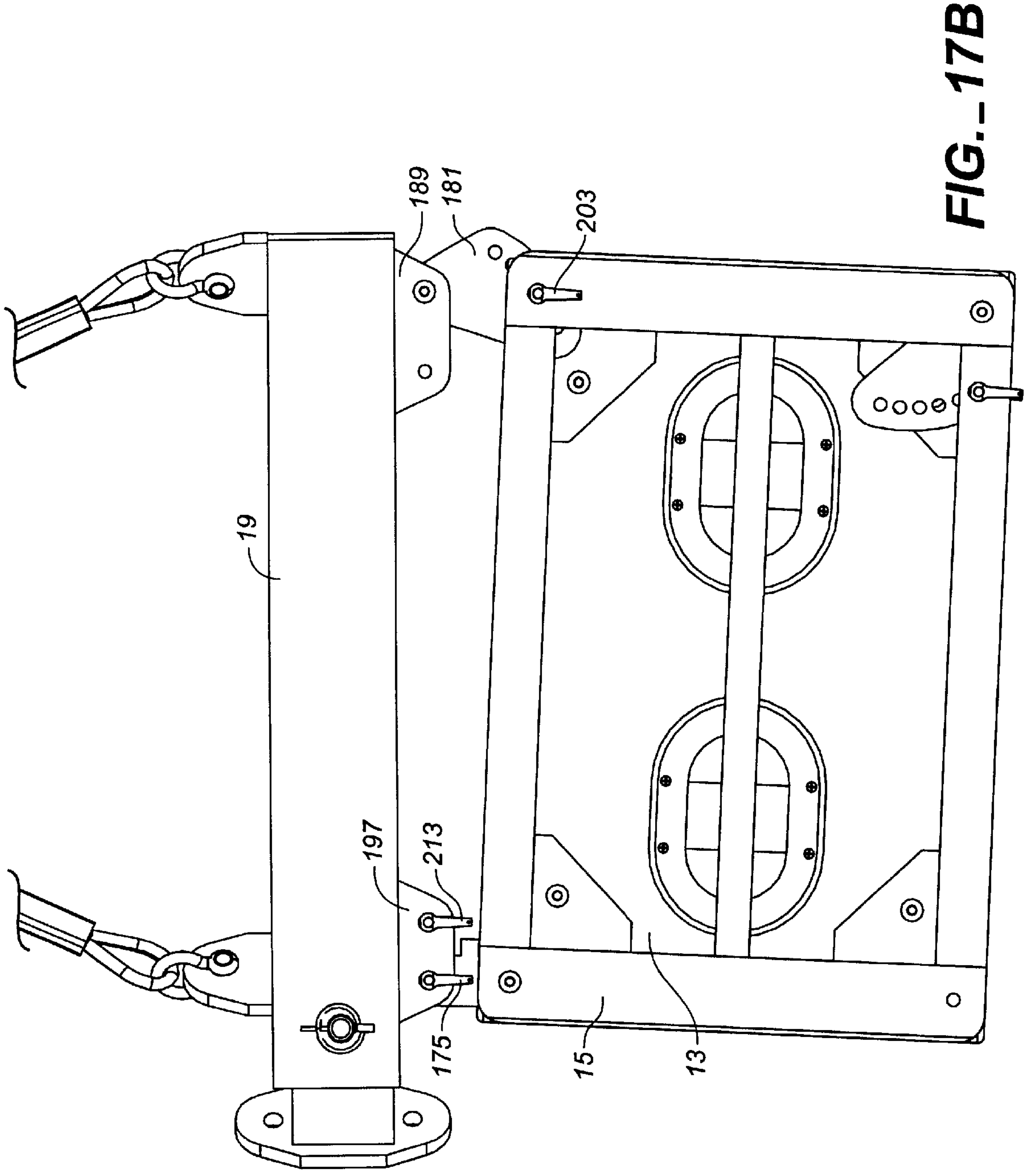
FIG. 17B is a side elevational view thereof showing the loudspeaker flown at a maximum negative angle relative to horizontal.

Adjustment in the angulation of the loudspeaker stack relative to the top lifting grid 19 is illustrated in FIGS. 17, and 17A–17B, all of which show the left side the top grid and topmost speaker in the stack. (It is noted that FIG. 16 shows the loudspeaker front facing to the left whereas FIGS. 17, 17A and 17B show the front of the speaker facing right.) In FIG. 17, a loudspeaker 13 having a left side frame 15 is shown connected to top grid 19 at a zero angle, that is, with a horizontal orientation to the top grid. In FIG. 17, the extension link 201 is stowed away in the top grid as indicated in phantom lines, and the cam plate link 183 associated with the top grid is rotated in its full clockwise position to achieve a minimum displacement between the point where it is connected to the top frame by quick release pin 203 and its pivot point 205 on the front attachment plates underneath the front corner 185 of the grid.

In FIG. 17A, the extension link 201 provided with the top grid is inserted between the grid's attachment plates 199 and the frame's rear link 59 to drop the rear corners of the side frame and loudspeaker. By leaving the cam plate in its original drop position, the rear link extension 201 produces a positive angle relative to horizontal and the front of the topmost speaker. In FIG. 17B, the rear extension link is again stowed away and the cam plate pivoted to its full counterclockwise position to achieve a maximum drop of the front corners of the side frames and loudspeaker. This produces a negative angle between the lifting grid and the topmost loudspeaker. By rotating the cam plate to different engagement positions, intermediate angles can be achieved between the maximum positive and negative angles shown in FIGS. 17A and 17B. It is contemplated that using the top grid illustrated in the drawings, the top of the speaker stack can be connected to the top grid 19 at angles ranging from plus and minus 5 degrees from horizontal in one degree increments.

Figure 18A:
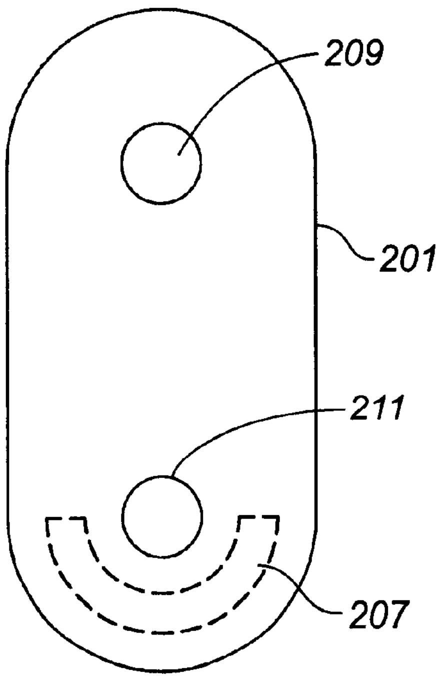
FIG. 18A is a side elevational view of the extension link for the top lifting grid used to produce the positive flying angle shown in FIG. 17A.
Figure 18B:
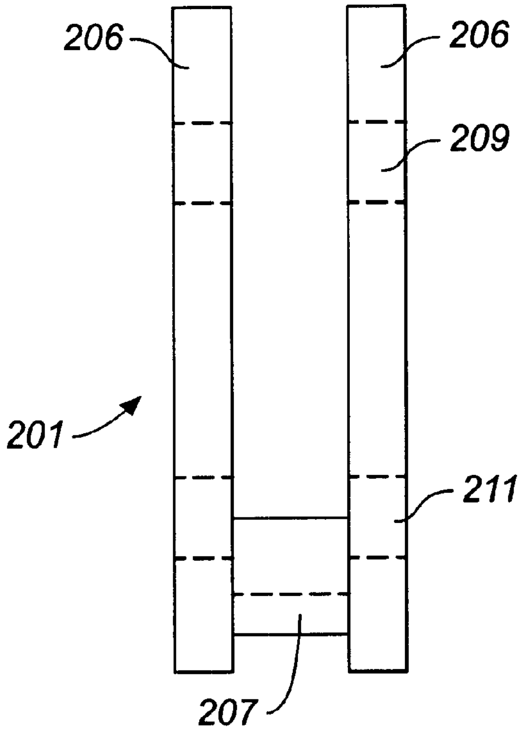
FIG. 18B is a front elevational view thereof.

The extension link 201 for the top grid is shown in greater detail in FIGS. 18A and 18B. Generally, the extension link is seen to be formed by two elongated side plates 206 connected by a spacer element 207, all of which are suitably fabricated of steel. The side plates have two opposed pin openings 209, 211 for receiving quick release pins when the extension link is pinned in its stowed and extended positions. As shown in FIGS. 17, 17A and 17B, an extra quick release pin 213 is provided for holding the extension link in its stowed position as shown in FIG. 17 and for connecting the extension link to the rear link 59 of the speaker side frame when the extension link is removed from its stowed position.

Figure 19B:
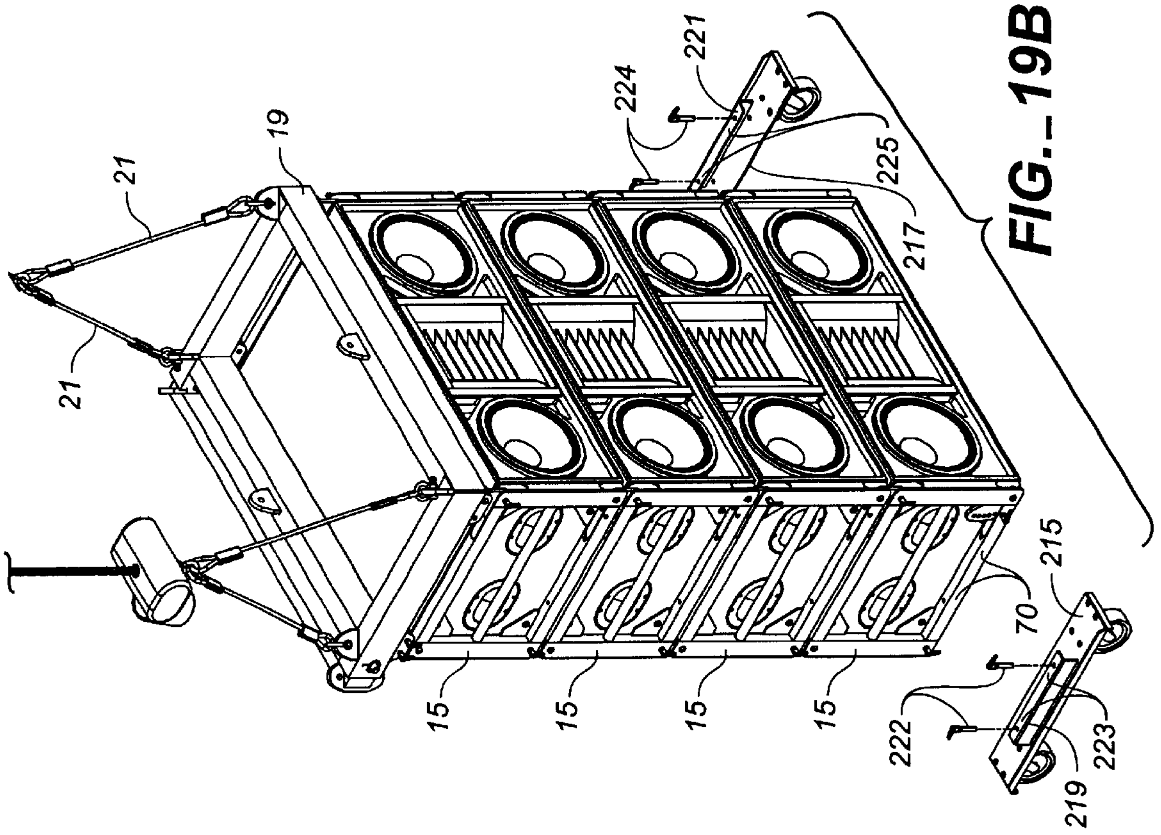
FIG. 19B is another top perspective view of the loudspeaker stack of FIG. 19A, showing the stack lifted off the transporting wheel frames by a rigging hoist and top lifting grid.
Figure 19A:
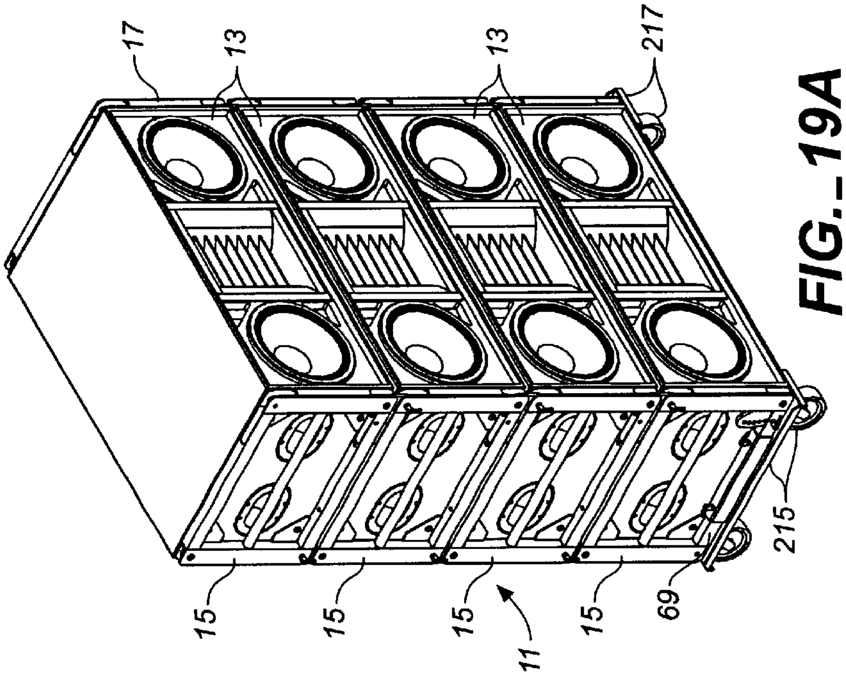
FIG. 19A is a top perspective view of a stack of four loudspeakers connected together by rigging side frames in accordance with the invention resting on top of wheel frames for transporting the stack.

FIGS. 19A and 19B generally illustrate the preferred means of transporting preassembled stacks of loudspeakers to their flying position so that the stacks can be lifted by a rigging hoist connected to top grid 19. In FIG. 19A, a vertical stack 11 comprised of four loudspeakers 13 interconnected in accordance with the invention by rigging side frames 15, 17 is wheeled into position by two wheel plates 215, 217 which are pinned to the bottom rails 69 of the side frames 15, 17 of the bottom most speaker in the stack. An angle iron 219, 221 having pin holes 223, 225 are provided on the top of the wheel plates for engaging the bottom rail of the side frames. Quick release pins 222, 224, which are of the same style as the quick release pins used to interconnect the rigging side frames, are used to pin the wheel plates in place. Pin holes 70 corresponding to the pin hole 223, 225 in wheel plate angle irons are provided in the bottom rail of each side frame for this purpose.

To lift the vertical loudspeaker stack 11, the top grid 19 is positioned over the stack as shown in FIG. 19B, after which the top grid is connected at its desired angulation to the topmost speaker in the stack. Once the top grid is attached, a rigging hoist can be used to take the load of the loudspeaker stack off of the wheel plates so that the wheel plates can be easily removed. Subsequent stacks of loudspeakers can thereafter be added to the stacks shown in FIG. 19B by transporting them under the stack on similar wheel plates and connecting the topmost loudspeaker in the new stack to the bottommost loudspeaker in the lifted stack. This interconnection is achieved by simply connecting the respective side frames of the bottommost and topmost loudspeakers in the manner described above.

Thus, it can be seen that the present invention provides an improved rigging system for flying vertical arrays of loudspeakers to achieve a desired coverage for a sound reinforcement system. The rigging system and hardware of the invention greatly facilitates installation and the flying of loudspeaker stacks, and improves the capability to make accurate adjustments in the vertical splay angle between loudspeakers in a stack. Because the linkage elements of the rigging hardware of the invention are captive parts, as opposed to separately handled elements, the risk of misplacing or losing these parts is eliminated.

What I claim is:

1. A rigging side frame for a loudspeaker which can be interconnected with rigging side frames of other loudspeakers for hanging loudspeakers in stacked relation, wherein each loudspeaker in the stack has sides to which left and right rigging frames can be mounted, said rigging side frame comprising

- a frame structure attachable to a side of a loudspeaker, said frame structure having a top end, a bottom end, a front, a rear, and rear corners,
- a rear link for pivotally linking the top rear corner of one rigging side frame mounted to one loudspeaker to the bottom rear corner of a rigging side frame mounted to another loudspeaker placed in stacked relation therewith, such that the rear corners of the stacked loudspeakers can be joined in a manner that permits the stacked loudspeakers to be pivotally splayed about the rear corners of the rigging side frames of the stacked loudspeakers,
- a cam plate link pivotally attached to a cam pivot point at one of the top and bottom ends of said frame structure and displaced from the rear corner toward the front of said frame structure, said cam plate link having at least two cam link openings located at a different radius from and a different angle about said cam pivot point, and
- a cam plate link attachment structure provided in the other of the top and bottom ends of said frame structure opposite said cam plate link for securing a cam plate link of another rigging side frame at a selected cam link opening of the cam plate link of the other rigging side frame, wherein a vertical splay angle between adjacent loudspeakers to which the adjacent side frames are mounted can be set according to which cam link opening of the cam plate link is selected to interconnect the side frames.

2. The rigging side frame of claim 1 wherein said cam plate link has multiple cam link openings located at different radii from and angles about said cam pivot point and wherein the adjacent loudspeakers to which the adjacent side frames are mounted can be set at a multiple different splay angles according to which of the multiple cam link openings of the cam plate link is selected to interconnect the side frames.

3. The rigging side frame of claim 2 wherein the multiple cam link openings of said cam plate link provide slay angles in increments of approximately one degree.

4. The rigging side frame of claim 2 wherein said cam plate link includes at least six cam openings for providing slay angles in increments of approximately one degree from approximately zero to five degrees.

5. The rigging side frame of claim 1 wherein the splay angles provided by said cam link openings begin at approximately zero degrees to permit loudspeakers to be connected together with no splay angle.

6. The rigging side frame of claim 1 wherein said cam plate link is pivotally attached to a cam pivot point at one of the top and bottom ends of said frame structure at the front of said frame structure.

7. The rigging side frame of claim 6 wherein said cam plate link is pivotally attached to the bottom end of said frame structure and said cam plate link attachment structure is provided in the top end of said frame structure opposite said cam plate for attaching a cam plate which drops down from above from a rigging side frame mounted to an adjacent stacked loudspeaker.

8. The rigging side frame of claim 1 wherein said rear link is extendably connected to one of the rear corners of said frame structure and wherein a rear link receiving structure is provided at the other rear corner of said frame structure for lockingly receiving an extended rear link of a side frame of an adjacent loudspeaker.

9. The rigging side frame of claim 8 wherein said rear link is connected to the rear corner at the top end of the frame structure.

10. The rigging side frame of claim 8 wherein said rear link is connected to the rear corner at the top end of the frame structure, said cam link plate is pivotally attached to the bottom end of said frame structure, and said cam plate link attachment structure is provided in the top end of said frame structure opposite said cam plate for attaching to a cam plate which drops down from above from a rigging side frame mounted to an adjacent stacked loudspeaker.

11. The rigging side frame of claim 1 wherein said frame structure is fabricated of metal tubing joined together to form a rectangular perimeter frame attachable to a side of a correspondingly sized loudspeaker, said perimeter frame being comprised of top and bottom perimeter rails forming the top and bottom ends of said frame structure and front and rear rails perimeter rails forming the front and rear of said frame structure, and wherein said rear and top and bottom perimeter rails form top and bottom rear corners of the perimeter frame, and said front and top and bottom perimeter rails form top and bottom front corners of the perimeter frame.

12. The rigging side frame of claim 11 wherein said cam plate link attachment structure includes

- channel openings in one of the said top and bottom perimeter rails of said perimeter frame for receiving a cam plate link deployed from a rigging side frame of an adjacent loudspeaker of a stack of loudspeakers, and
- at least one pin hole in said perimeter frame to which a selected one of the cam link openings in a cam plate link of a rigging side frame of an adjacent loudspeaker can be aligned for pinning the cam plate link of one rigging side frame to the perimeter frame of another rigging side frame to achieve a desired splay angle between loudspeakers.

13. The rigging side frame of claim 12 wherein channel openings are provided in one of the bottom and top perimeter rails of said perimeter frame opposite the channel openings of said cam plate link attachment structure to permit the cam plate link of the rigging side frame to be pivoted to a stowed position within the perimeter frame.

14. The rigging side frame of claim 13 wherein at least one pin hole is provided in said perimeter frame at the channel openings for stowing said cam plate link to permit the cam plate link to be pinned in a stowed position.

15. The rigging side frame of claim 14 wherein said cam plate link is pivotally attached to a cam pivot point at the bottom end of said perimeter frame and said cam plate link attachment structure is provided in the top end of said perimeter frame opposite said cam plate for securing a cam plate which drops down from above from a side frame mounted to an adjacent stacked loudspeaker.

16. A rigging side frame for a loudspeaker which can be interconnected with rigging side frames of other loudspeakers for hanging loudspeakers in stacked relation, wherein each loudspeaker in the stack has sides to which left and right rigging frames can be mounted, said rigging side frame comprising a rectangular frame structure attachable to a side of a correspondingly sized loudspeaker, said frame structure having a top end, a bottom end, a front, a rear, front corners, and rear corners, a rear link attached to the top rear corner of said frame structure for pivotally linking the top rear corner of said frame structure to the bottom rear corner of the frame structure of a rigging side frame mounted to an adjacent stacked loudspeaker, such that the rear corners of the stacked loudspeakers can be linked together in a manner that permits the stacked loudspeakers to be pivotally splayed about the rear corners of the rigging side frames of the stacked loudspeakers, a cam plate link pivotally attached to a cam pivot point at the bottom end of said frame structure near the bottom front corner thereof and capable of being pivoted from a stowed position within said frame structure to a deployed position, said cam plate link having multiple cam link openings located at different radii from and different angles about said cam pivot point, and a cam plate link attachment structure provided in the top end of said frame structure near the front top corner thereof for securing a deployed cam plate link of another rigging side frame at a selected cam link opening of the cam plate link of the other rigging side frame, wherein a vertical splay angle between adjacent stacked loudspeakers to which the adjacent side frames are mounted can be set according to which cam link opening of the cam plate link is selected to interconnect the side frames.

17. The rigging side frame of claim 16 wherein said frame structure includes pin holes near the front corners thereof for pinning the cam plate link in its stowed position and for pinning a deployed cam plate link of one rigging side frame to the cam plate attachment structure of the frame structure of another rigging side frame.

18. The rigging side frame of claim 17 further comprising a cam plate link quick release pin for pinning the cam plate link in its stowed position within the frame structure when stowed and to the frame structure of an adjacent rigging side frame when deployed.

19. The rigging side frame of claim 16 wherein said rear link is pivotally attached to the top rear corner of said frame structure so that it can be pivoted from a stowed position within said frame structure to a deployed position for connecting to the rear corner of the frame structure of a rigging side frame mounted to an adjacent stacked loudspeaker.

20. The rigging side frame of claim 19 wherein said frame structure further includes at least one pin hole at the bottom rear corner thereof for pinning a deployed rear link of a rigging side frame of an adjacent loudspeaker to the bottom rear corner of said frame structure.

21. The rigging side frame of claim 20 further comprising a rear link quick release pin for pinning a deployed rear link of a rigging side frame of an adjacent loudspeaker to the bottom rear corner of said frame structure using the pin hole at the bottom rear corner thereof.

22. A rigging side frame for a loudspeaker which can be interconnected with rigging side frames of other loudspeakers for hanging loudspeakers in stacked relation, wherein each loudspeaker in the stack has sides to which left and right rigging frames can be mounted, said rigging side frame comprising a rectangular frame structure attachable to a side of a correspondingly sized and shaped loudspeaker, said frame structure having a top end, a bottom end, a front, a rear, front corners, and rear corners, and further including a pin hole at the bottom rear corner thereof and pin holes near the front corners thereof, a rear link pivotally attached to the top rear corner of said frame structure so that it can be pivoted from a stowed position within said frame structure to a deployed position for connecting to the bottom rear corner of an adjacent stacked loudspeaker, such that the rear corners of the stacked loudspeakers can be linked together in a manner that permits the stacked loudspeakers to be pivotally splayed about the rear corners of the rigging side frames of the stacked loudspeakers, a cam plate link pivotally attached to a cam pivot point at the bottom end of said frame structure near the bottom front corner thereof and capable of being pivoted from a stowed position within said frame structure to a deployed position, said cam plate link having multiple cam link openings located at different radii from and different angles about said cam pivot point, a cam plate link attachment structure provided in the top end of said frame structure near the front top corner thereof for securing a deployed cam plate link of another rigging side frame at a selected cam link opening of the cam plate link of the other rigging side frame, wherein a vertical splay angle between adjacent stacked loudspeakers to which the rigging side frames are mounted can be set according to which cam link opening of the cam plate link is selected to interconnect the side frames, a cam plate link quick release pin for pinning the cam plate link in its stowed position within the frame structure when not in use and to the frame structure of an adjacent rigging side frame when deployed, and a rear link quick release pin for pinning a deployed rear link of a rigging side frame of an adjacent loudspeaker to the bottom rear corner of said frame structure using the pin hole at the bottom rear corner thereof.

23. A rigging system for hanging loudspeakers in stacked relation wherein each loudspeaker in the stack has left and right sides, said rigging system comprising left rigging side frames for mounting to the left sides of a set of loudspeakers cable of being stacked to form a stacked array of loudspeakers, right rigging side frames for mounting to the right sides of such stackable loudspeakers, each of said left and right side rigging frames comprising a frame structure having a top end, a bottom end, a front, a rear, and rear corners, a rear link for pivotally linking the top rear corner of the left and right rigging side frames mounted to one loudspeaker to the bottom rear corner of the left and right rigging side frames mounted to another loudspeaker placed in stacked relation therewith, such that the rear corners of the stacked loudspeakers can be joined by the rigging side frames in a manner that permits the stacked loudspeakers to be pivotally splayed about the rear corners of the side frames of the stacked loudspeakers, a cam plate link pivotally attached to a cam pivot point at one of the top and bottom ends of said frame structure and displaced from the rear corner toward the front of said frame structure, said cam plate link having at least two cam link openings located at a different radius from and a different angle about said cam pivot point, and a cam plate link attachment structure provided in the other of the top and bottom ends of said frame structure opposite said cam plate link for securing a cam plate link of another rigging side frame at a selected cam link opening of the cam plate link of the other rigging side frame, wherein vertical splay angles between adjacent loudspeakers within the stack of loudspeakers can be set according to which cam link opening of the cam plate links of the rigging side frames is selected to interconnect the side frames.

24. The rigging system of claim 23 wherein the left and right rigging side frames are substantial mirror images of each other.

25. The rigging system of claim 23 further comprising a top lifting grid for engaging and lifting the stack of loudspeakers, said top lifting grid including linkage means for linking the top lifting grid to the top end of the frame structures of the left and right rigging side frames of the top-most loudspeaker in a stack of loudspeakers.

26. The rigging system of claim 25 wherein said top lifting grid has left and right front corners and left and right rear corners, and wherein said linkage means includes left and right cam plate links pivotally attached to cam pivot points displaced from the rear corners toward the front corners of said grid for engaging the cam plate link attachment structures at the top end of the frame structures of the left and right rigging side frames of the top-most loudspeaker in the stack of loudspeakers, said cam plate link having at least two cam link openings located at a different radius from and a different angle about said cam pivot point wherein a vertical splay angle between the top lifting grid and the top-most loudspeaker of the stack of loudspeakers can be set according to which cam link opening of the cam plate links of the top lifting grid is selected.

27. The rigging system of claim 23 wherein the cam plate links of said rigging side frames have multiple cam link openings located at different radii from and angles about the cam pivot points for the cam link plates and wherein the adjacent stacked loudspeakers to which adjacent rigging side frames are mounted can be set at a multiple different splay angles according to which of the multiple cam link openings of the cam plate links is selected to interconnect the side frames for the loudspeaker stack.

28. The rigging system of claim 27 wherein the multiple cam link openings of said cam plate links provide slay angles in increments of approximately one degree.

29. The rigging system of claim 27 wherein said cam plate links include at least six cam openings for providing slay angles in increments of approximately one degree from approximately zero to five degrees.

30. The rigging side frame of claim 27 wherein the splay angles provided by said cam link openings begin at approximately zero degrees to permit loudspeakers to be connected together with no splay angle.

* * * * *